United States Patent
Hashimoto

(10) Patent No.: US 9,032,264 B2
(45) Date of Patent: May 12, 2015

(54) TEST METHOD FOR NONVOLATILE MEMORY

(71) Applicant: Kabushiki Kaisha Toshiba, Minato-ku (JP)

(72) Inventor: Daisuke Hashimoto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 155 days.

(21) Appl. No.: 13/930,315

(22) Filed: Jun. 28, 2013

(65) Prior Publication Data

US 2014/0289559 A1  Sep. 25, 2014

Related U.S. Application Data

(60) Provisional application No. 61/803,932, filed on Mar. 21, 2013.

(51) Int. Cl.
G11C 29/00 (2006.01)
G11C 29/08 (2006.01)
G11C 16/00 (2006.01)
G11C 29/04 (2006.01)

(52) U.S. Cl.
CPC ............... *G11C 29/08* (2013.01); *G11C 16/00* (2013.01); *G11C 2029/0401* (2013.01)

(58) Field of Classification Search
CPC ........................ G06F 11/2733; G11C 29/08
See application file for complete search history.

(56) References Cited

U.S. PATENT DOCUMENTS

| | | | |
|---|---|---|---|
| 7,453,728 B2 | 11/2008 | Noguchi et al. | |
| 7,613,048 B2 | 11/2009 | Inoue et al. | |
| 7,996,726 B2 | 8/2011 | Ito | |
| 8,000,927 B2 | 8/2011 | Sukegawa | |
| 8,037,380 B2 | 10/2011 | Cagno et al. | |
| 8,250,380 B2 | 8/2012 | Guyot et al. | |
| 8,284,601 B2 | 10/2012 | Son et al. | |
| 8,296,508 B1 | 10/2012 | Zanardi et al. | |

(Continued)

FOREIGN PATENT DOCUMENTS

| | | |
|---|---|---|
| JP | 2001-273792 | 10/2001 |
| JP | 2003-7074 | 1/2003 |

(Continued)

OTHER PUBLICATIONS

Curtis E. Stevens Information technology ATA/ATAPI Command Set (ACS-2), Working Draft Project American National Standard, T13/2015-D, Revision 6, Feb. 22, 2011, 15 pages.

(Continued)

*Primary Examiner* — Sam Rizk
(74) *Attorney, Agent, or Firm* — Oblon, McClelland, Maier & Neustadt, L.L.P.

(57) ABSTRACT

According to one embodiment, a test method for testing a nonvolatile semiconductor memory including first and second areas includes performing first to sixth processes every block included in the first area. The first process performs block erase. The second process writes data to a first block. The third process reads data from first pages except a second page in the first block. The fourth process reads data from the second page. The fifth process records an event of a first read error in the second area when a read error happens in the third process. The sixth process records an event of a second read error in the second area when a read error happens in the fourth process.

20 Claims, 36 Drawing Sheets

(56) References Cited

U.S. PATENT DOCUMENTS

| | | |
|---|---|---|
| 8,372,720 B2 | 2/2013 | Fukuzumi et al. |
| 8,386,537 B2 | 2/2013 | Boyd et al. |
| 8,402,069 B2 | 3/2013 | Rajaram et al. |
| 8,418,042 B2 | 4/2013 | Kanno |
| 2007/0208915 A1 | 9/2007 | Tran et al. |
| 2008/0181018 A1 | 7/2008 | Nagadomi et al. |
| 2008/0263305 A1 | 10/2008 | Shu et al. |
| 2008/0288814 A1 | 11/2008 | Kitahara |
| 2009/0172267 A1 | 7/2009 | Oribe et al. |
| 2009/0217111 A1 | 8/2009 | Ito |
| 2009/0228641 A1 | 9/2009 | Kurashige |
| 2010/0131809 A1* | 5/2010 | Katz ............................ 714/719 |
| 2011/0176362 A1 | 7/2011 | Shibata et al. |
| 2011/0188307 A1 | 8/2011 | Kito et al. |
| 2012/0124275 A1 | 5/2012 | Hashimoto |
| 2012/0278564 A1 | 11/2012 | Goss et al. |
| 2012/0284453 A1 | 11/2012 | Hashimoto |
| 2012/0300331 A1 | 11/2012 | Deetz et al. |
| 2013/0124932 A1 | 5/2013 | Schuh et al. |
| 2013/0159785 A1 | 6/2013 | Hashimoto |
| 2013/0159814 A1 | 6/2013 | Hashimoto |

FOREIGN PATENT DOCUMENTS

| | | |
|---|---|---|
| JP | 2006-127582 | 5/2006 |
| JP | 2008-181380 | 8/2008 |
| JP | 2008-287404 | 11/2008 |
| JP | 2009-224013 | 10/2009 |
| JP | 4439539 | 1/2010 |
| JP | 4635061 | 11/2010 |
| JP | 2011-150750 | 8/2011 |
| JP | 2011-159364 | 8/2011 |

OTHER PUBLICATIONS

Curtis E. Stevens Information technology ATA/ATAPI Command Set (ACS-3), Working Draft Project American National Standard, T13/2161-D, Revision 4, Sep. 4, 2012, 19 pages.

NVM Expression Revision 1.1, Oct. 11, 2012, 4 pages.

\* cited by examiner

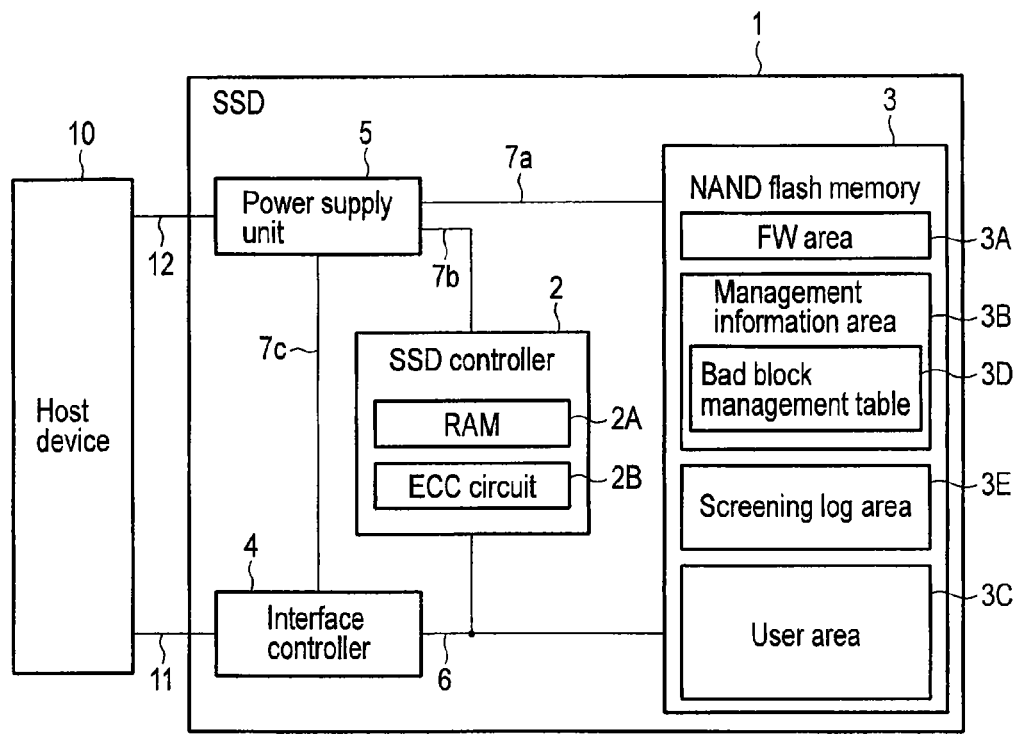
F I G. 1
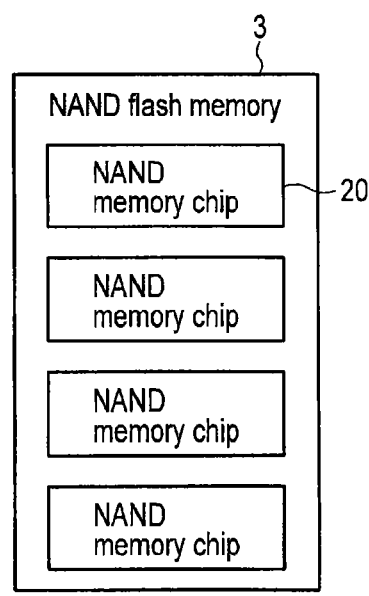
F I G. 2

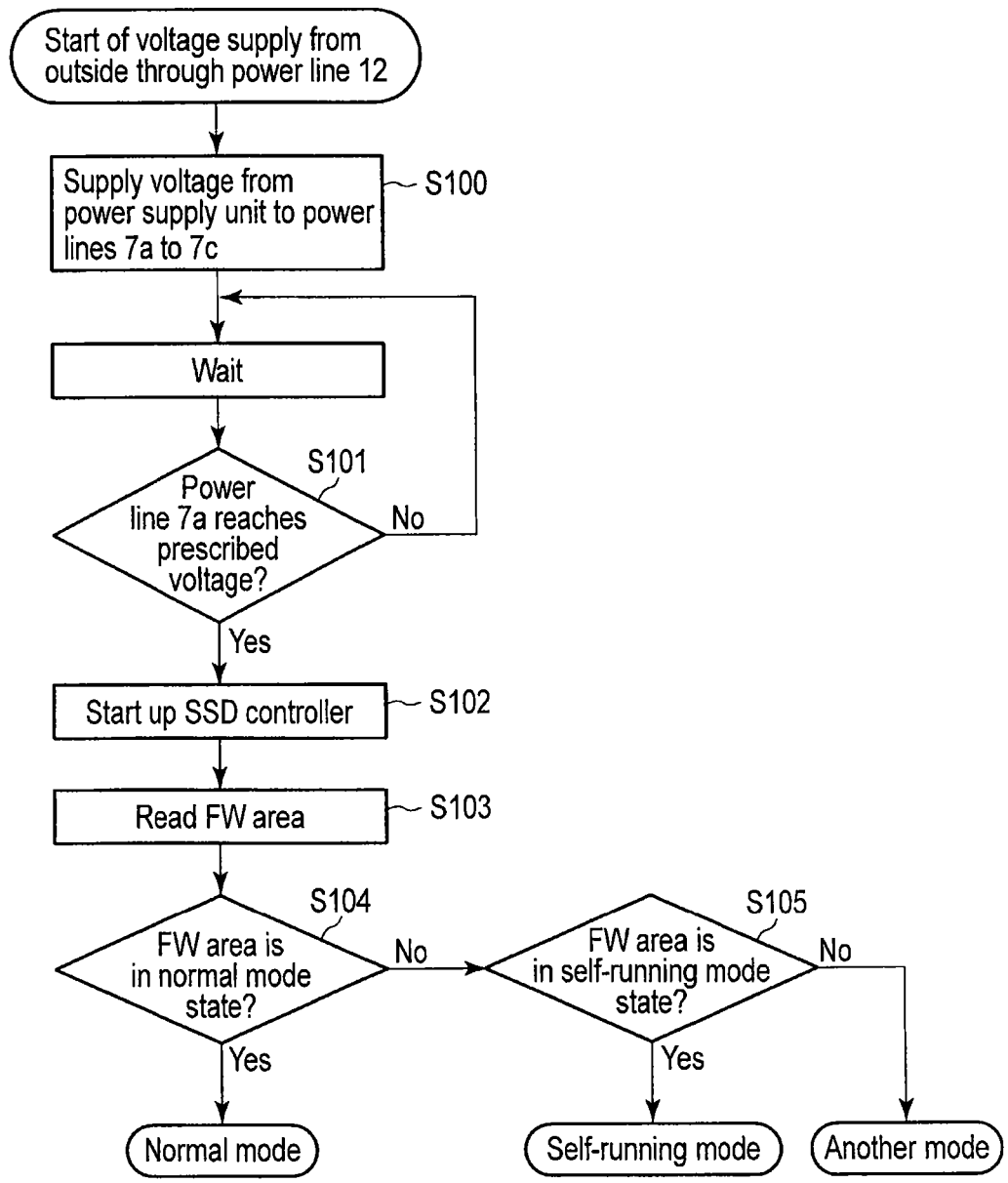
F I G. 7

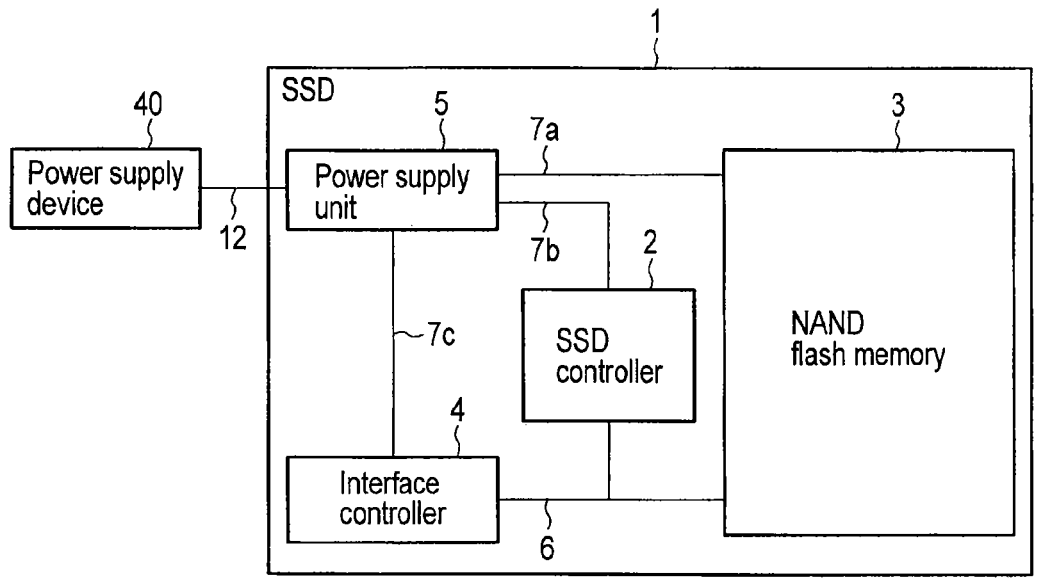
F I G. 8
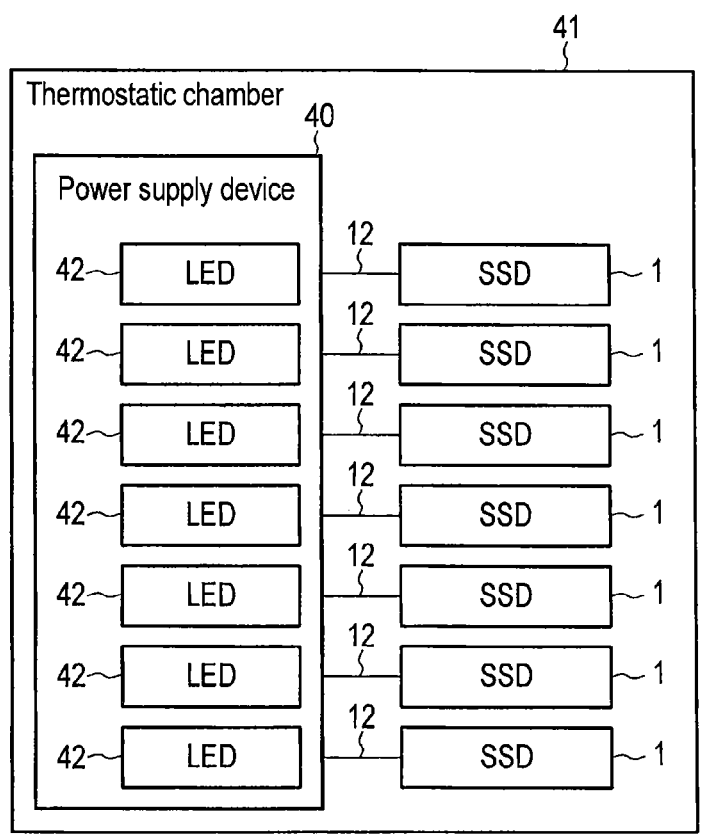
F I G. 9

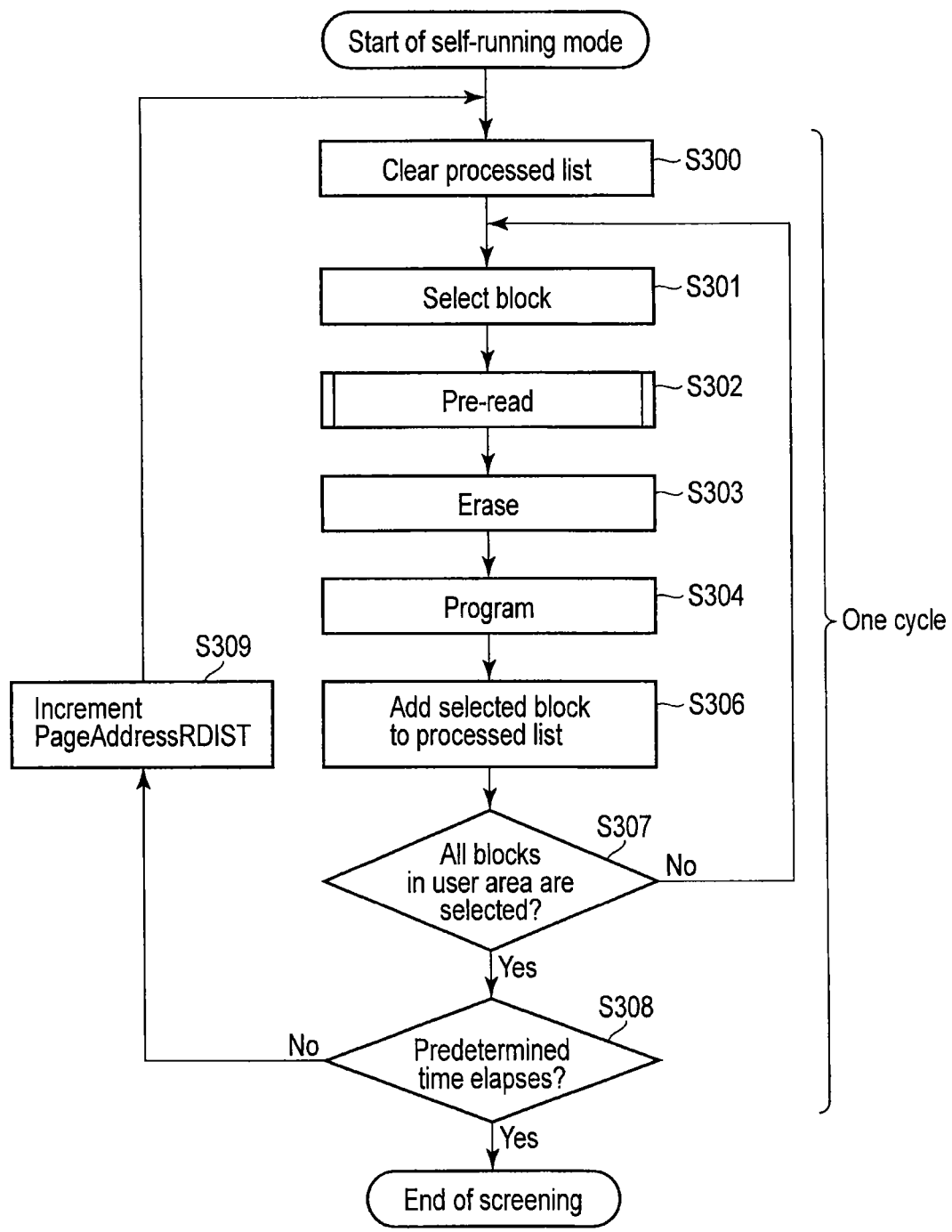
F I G. 10 A

| Page Address | Read order |
|---|---|
| 0 | 0 |
| 1 | 1 |
| 2 | 2 |
| 3 | 3 |
| ⋮ | ⋮ |
| PageAddressRDIST-1 | PageAddressRDIST-1 |
| PageAddressRDIST | 255 |
| PageAddressRDIST+1 | PageAddressRDIST |
| PageAddressRDIST+2 | PageAddressRDIST+1 |
| ⋮ | ⋮ |
| 254 | 253 |
| 255 | 254 |

FIG. 13

| Page Address | Read order |
|---|---|
| 0 | 0 |
| 1 | 1 |
| 2 | 2 |
| 3 | 3 |
| ⋮ | ⋮ |
| PageAddressRDIST-1 | PageAddressRDIST-1 |
| PageAddressRDIST | PageAddressRDIST and 256 |
| PageAddressRDIST+1 | PageAddressRDIST+1 |
| PageAddressRDIST+2 | PageAddressRDIST+2 |
| ⋮ | ⋮ |
| 254 | 254 |
| 255 | 255 |

FIG. 14

| Cycle number | Value of PageAddessRDIST |
|---|---|
| 0 | 0 |
| 1 | 1 |
| 2 | 2 |
| 3 | 3 |
| ⋮ | ⋮ |
| PageAddressRDIST-1 | PageAddressRDIST-1 |
| PageAddressRDIST | PageAddressRDIST |
| PageAddressRDIST+1 | PageAddressRDIST+1 |
| PageAddressRDIST+2 | PageAddressRDIST+2 |
| ⋮ | ⋮ |
| 254 | 254 |
| 255 | 255 |

Screening log area 3E

| Event number | Time stamp | Cycle number | Error type | Temperature (°C) | Physical address in which error happens |
|---|---|---|---|---|---|
| 0 | 3514 | 1 | Write error | 40 | ... |
| 1 | 3820 | 3 | Write error | 45 | ... |
| 2 | 3820 | 3 | Normal read error | 50 | ... |
| 3 | 3906 | 3 | Erase error | 80 | ... |
| 4 | 4703 | 6 | Normal read error | 70 | ... |
| 5 | 5523 | 7 | Pre-read failure | 60 | ... |
| 6 | 6406 | 9 | Normal read error | 50 | ... |
| 7 | 6615 | 9 | Disturb failure | 80 | ... |
| 8 | 6661 | 9 | Write error | 0 | ... |
| 9 | 7162 | 10 | Disturb failure | -10 | ... |
| ... | ... | ... | ... | ... | ... |

F I G. 17

Screening log area 3E

| Event number | Time stamp | Cycle number | Error type | Temperature (°C) | Physical address in which error happens |
|---|---|---|---|---|---|
| 0 | 3514 | 1 | Write error | 40 | ... |
| 1 | 3820 | 3 | Write error | 45 | ... |
| 2 | 3820 | 3 | Normal read error | 50 | ... |
| 3 | 3906 | 3 | Erase error | 80 | ... |
| 4 | 4703 | 6 | Normal read error | 70 | ... |
| 5 | 5523 | 7 | Pre-read failure | 60 | ... |
| 6 | 6406 | 9 | Normal read error | 50 | ... |
| 7 | 6615 | 9 | Disturb failure | 80 | ... |
| 8 | 6661 | 9 | Write error | 0 | ... |
| 9 | 7162 | 10 | Disturb failure | -10 | ... |
| ... | ... | ... | ... | ... | ... |

| NAND Memory chip address | Accumulated count of disturb failure |
|---|---|
| 0 | 0 |
| 1 | 54 |
| 2 | 154 |
| 3 | 5 |

FIG. 18

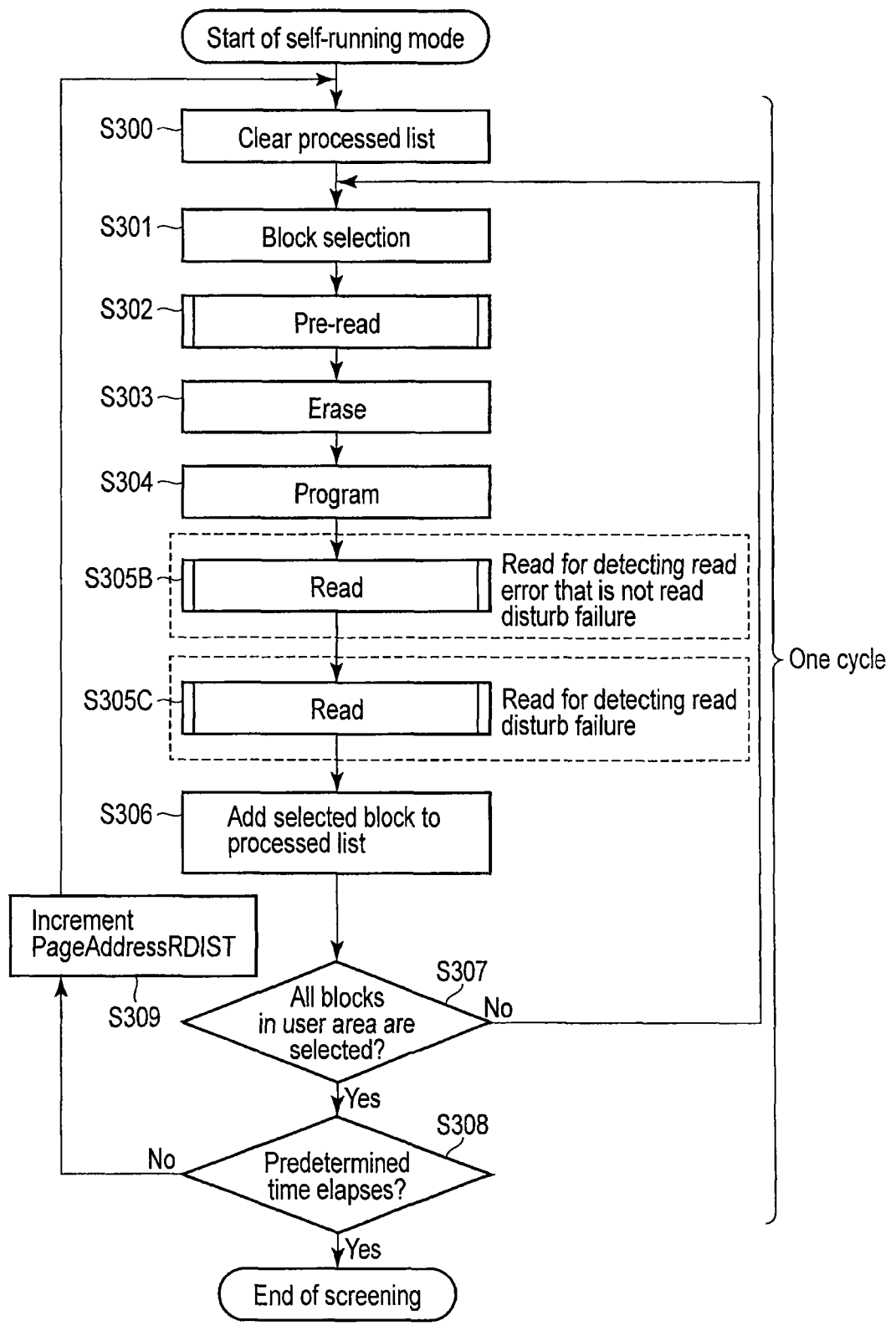
F I G. 30

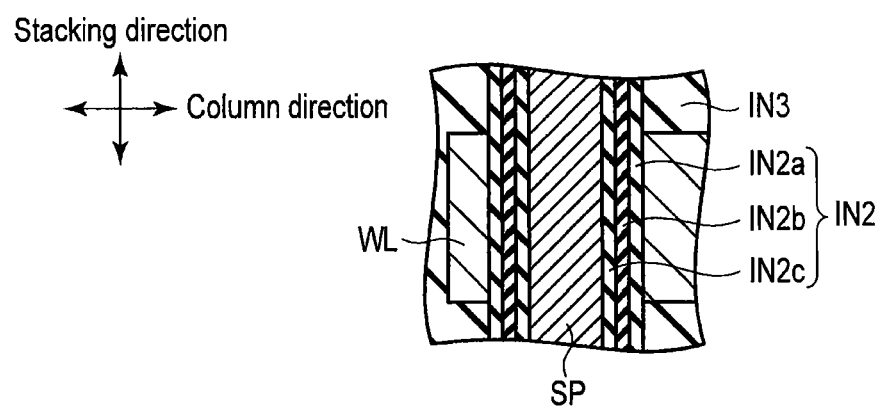
F I G. 36

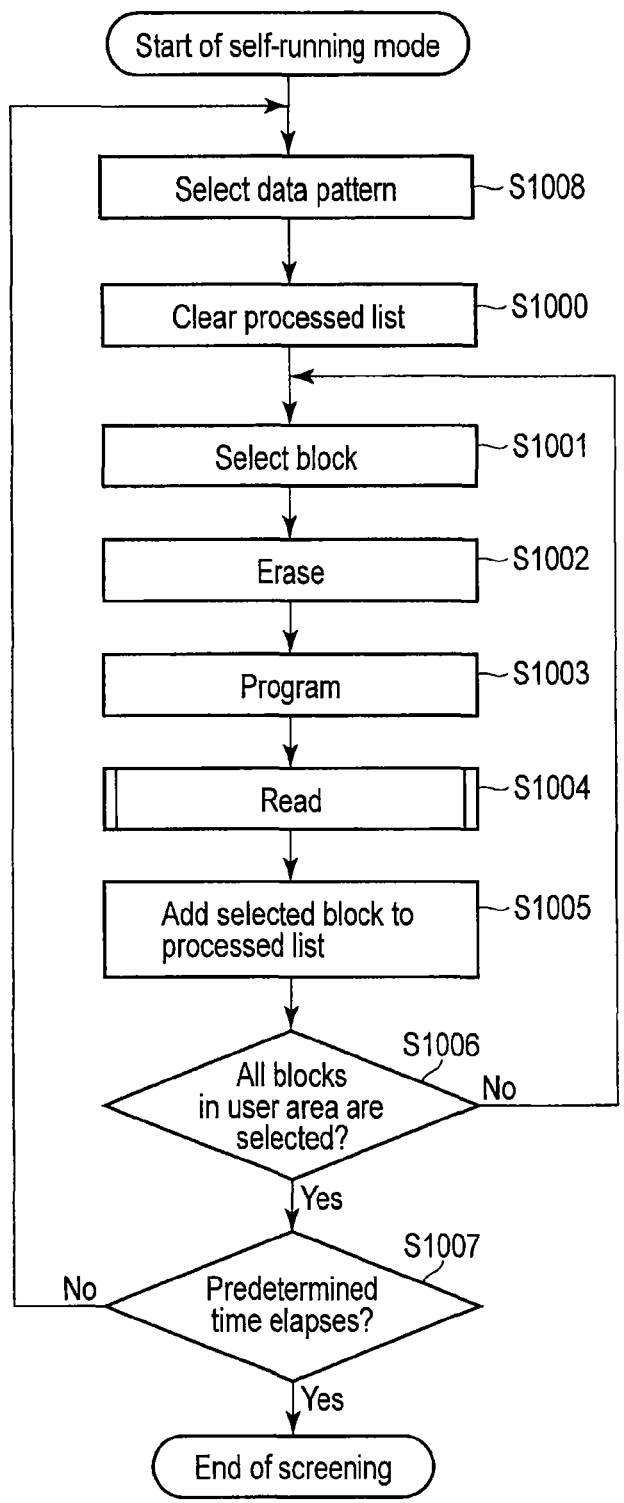
F I G. 37

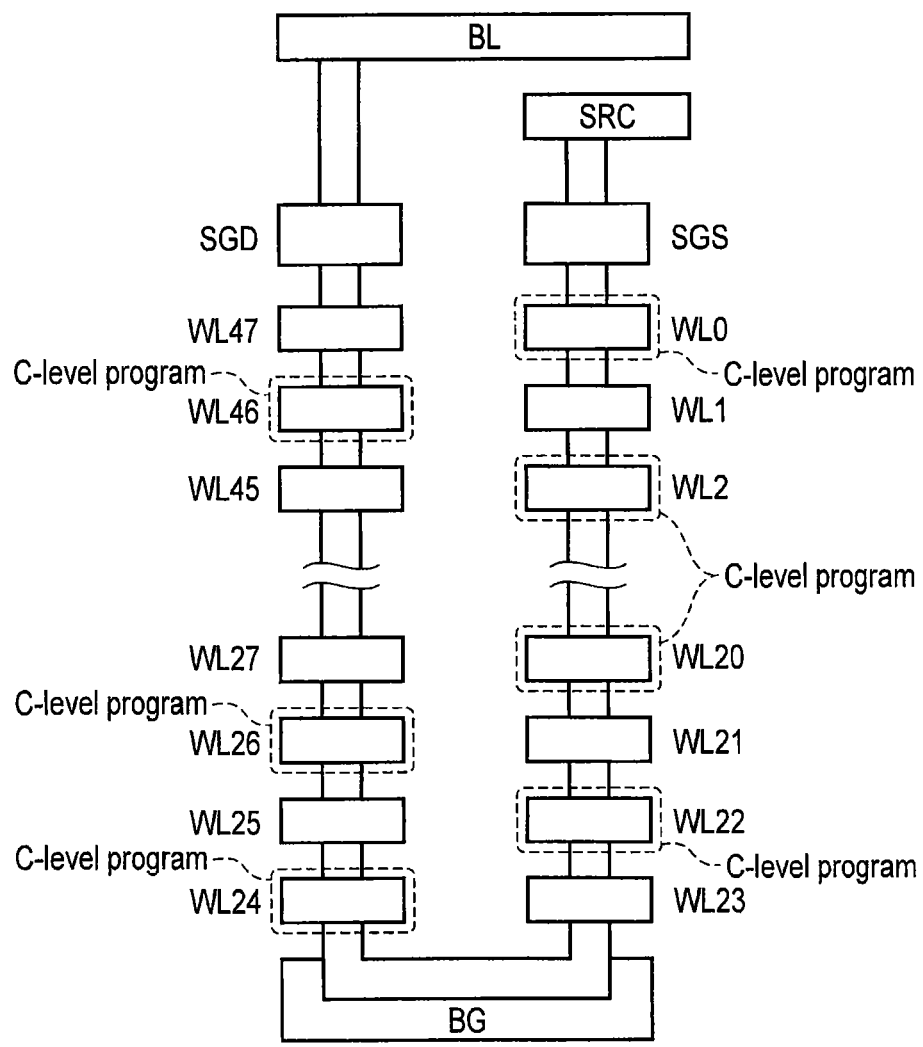
F I G. 3 8

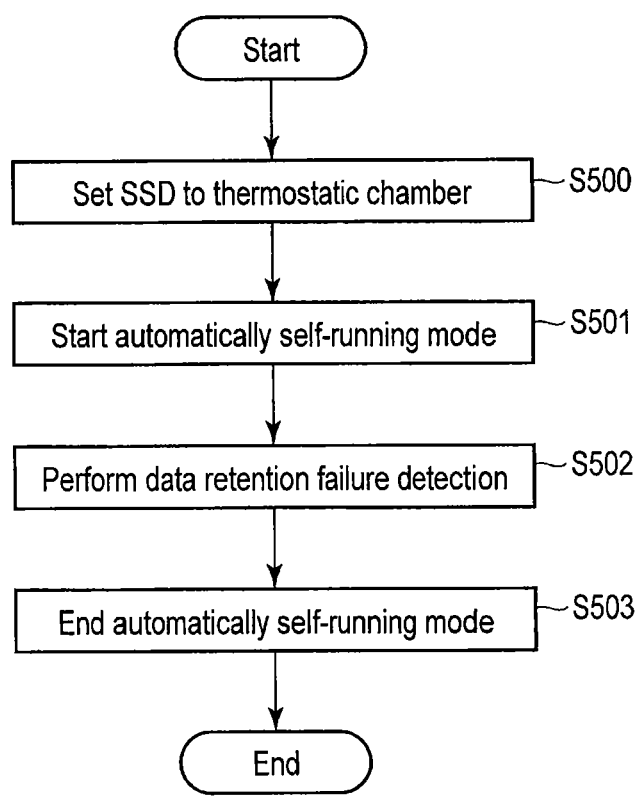
F I G. 4 1

TEST METHOD FOR NONVOLATILE MEMORY

CROSS-REFERENCE TO RELATED APPLICATIONS

This application claims the benefit of U.S. Provisional Application No. 61/803,932, filed Mar. 21, 2013, the entire contents of which are incorporated herein by reference.

FIELD

Embodiments described herein relate generally to a test method for nonvolatile memory.

BACKGROUND

In addition to an HDD (Hard Disk Drive), an SSD (Solid State Drive) is used as an external storage device for information processing devices such as a personal computer. The SSD includes a NAND flash memory as a nonvolatile semiconductor memory.

For example, in the case that the SSD is used in the same environment as the HDD, if data is rewritten frequently, the SSD will age (wear out) faster. Therefore, when an insufficient test (screening) is performed before product shipment, a failure rate increases after the product shipment.

In order to improve reliability of the SSD, it is conceivable that the data is repeatedly rewritten in the SSD during a screening process before the product shipment. However, the screening increases a screening time and a screening cost.

BRIEF DESCRIPTION OF THE DRAWINGS

FIG. 1 is a block diagram of a memory system according to a first embodiment;
FIG. 2 is a block diagram of a NAND flash memory;
FIG. 7 is a flowchart illustrating a start-up sequence of the SSD;
FIG. 8 is a schematic diagram of a power-supply device;
FIG. 9 is a schematic diagram of a thermostatic chamber and the power-supply device;
FIG. 10A is a flowchart illustrating the screening operation;
FIG. 13 is a view illustrating order of page read;
FIG. 14 is a view illustrating order of page read;
FIG. 17 is a view illustrating an example of a screening log;
FIG. 18 is a view illustrating an example of the screening log;
FIG. 30 is a flowchart illustrating a screening operation according to a fifth embodiment;
FIG. 36 is a sectional view of the memory cell;
FIG. 37 is a flowchart illustrating an SSD screening operation according to a sixth embodiment;
FIG. 38 is a view illustrating a program operation;
FIG. 41 is a flowchart illustrating entire screening.

DETAILED DESCRIPTION

Figure 3:
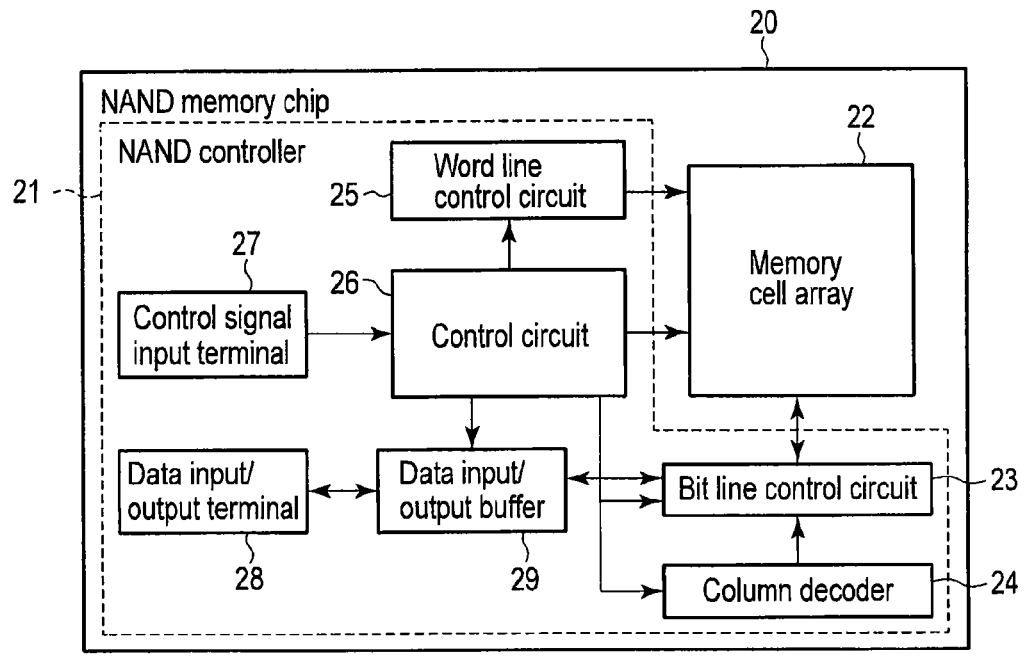
FIG. 3 is a block diagram of a NAND memory chip.

In general, according to one embodiment, there is provided a non-transitory computer-readable storage medium having stored thereon a program for testing a nonvolatile semiconductor memory which is executable by a computer, the nonvolatile semiconductor memory including a first area and a second area, each of the first area and the second area including blocks, data being written in a unit of page to the first area and the second area, data being erased in a unit of block that is of a multiple of a natural number of at least 2 of the unit of page, wherein the program is configured to cause a controller that controls the nonvolatile semiconductor memory to perform a first test process, the first test process performs first to sixth processes every block included in the first area, the first process performs block erase, the second process performs data write to a first block to which the block erase is performed after the first process, the third process performs first read in which data is read from first pages except a second page in the first block after the second process, the fourth process performs second read in which data is read from the second page after the third process, the fifth process records an event indicating a first read error in the second area when a read error happens in the third process, and the sixth process records an event indicating a second read error in the second area when a read error happens in the fourth process.

Hereinafter, embodiments of the present invention will be described with reference to the drawings. In the following description, an element having the function and configuration is designated by the same numeral, and the overlapping description is made only as needed basis.

Each functional block can be implemented by hardware, computer software, or a combination thereof. Therefore, the following description is made from the viewpoint of function such that the functional block clearly becomes one of the hardware, the computer software, and the combination thereof. Whether the function is implemented as the hardware or the software depends on the specific example or a design restriction applied to a whole system. Those skilled in the art can implement the functions by various methods every specific example, and any implementing technique is included in the embodiment. It is not necessary that each functional block be divided like the following specific example. For example, some functions may be performed by a functional block different from a functional block illustrated in the following description. The illustrative functional block may be divided into finer functional sub-blocks. Any functional block does not specify the embodiment.

First Embodiment

[1. Configuration of Memory System]

FIG. 1 is a block diagram of a memory system 1 according to a first embodiment. The memory system 1 includes a nonvolatile semiconductor storage device 3. The nonvolatile semiconductor storage device 3 is a nonvolatile memory (a non-transitory memory) in which data is not lost even if power is shut down. In the first embodiment, a NAND flash memory is described as an example of the nonvolatile semiconductor storage device 3. An SSD (Solid State Drive) including the NAND flash memory is described as an example of the memory system 1.

The SSD 1 is connected to a host device 10 (an information processing device) through an interface 11 and a power supply line 12. For example, the host device 10 is constructed by a personal computer, a CPU core, an SSD tester, or a server connected to a network. The host device 10 performs data access control to the SSD 1 and, for example, transmits a write request, a read request, and an erase request to the SSD 1 to write, read, and erase the data to, from, and from the SSD 1.

The SSD 1 includes an SSD controller (a storage device controlling unit) 2, the NAND flash memory 3, an interface controller (an interface unit) 4, and a power supply unit 5. The SSD controller 2, the interface controller 4, and the NAND flash memory 3 are connected to one another through a bus 6.

The power supply unit 5 is connected to the host device 10 through the power supply line 12 to receive an external power supplied from the host device 10. The power supply unit 5 and the NAND flash memory 3 are connected through a power supply line 7a, the power supply unit 5 and the SSD controller 2 are connected through a power supply line 7b, and the power supply unit 5 and the interface controller 4 are connected through a power supply line 7c. The power supply unit 5 boosts and steps down the external power to generate various voltages, and supplies the various voltages to the SSD controller 2, the NAND flash memory 3, and the interface controller 4.

The interface controller 4 is connected to the host device 10 through the interface 11. The interface controller 4 performs a interface process together with the host device 10. For examples of the interface 11 include an SATA (Serial Advanced Technology Attachment), a PCI Express (Peripheral Component Interconnect Express), a SAS (Serial Attached SCSI), an USB (Universal Serial Bus), a fiber channel, and Ethernet. In the first embodiment, by way of example, the SATA is used as the interface 11.

The data is stored in the NAND flash memory 3 in a nonvolatile manner. A firmware (FW) area 3A in which firmware is stored, a management information area 3B in which management information is stored, a user area 3C in which user data is stored, and a screening log area 3E in which various logs in a test process are stored are reserved in a physical address space of the NAND flash memory 3. A circuit configuration of the NAND flash memory 3 is described later.

The SSD controller 2 controls various operations of the SSD 1. The function of the SSD controller 2 is implemented by a processor that performs the firmware stored in the FW area 3A of the NAND flash memory 3 and various hardware circuits. The SSD controller 2 performs data transfer control between the host device 10 and the NAND flash memory 3 with respect to various commands such as a write request, a cache flash request, and a read request from the host device 10, updates and manages various management tables stored in a RAM 2A and the NAND flash memory 3, and performs a screening process. When receiving the power through the power supply line 7b, the SSD controller 2 reads the firmware from the FW area 3A, and then performs the process based on the read firmware. The SSD controller 2 includes the RAM 2A that is of a cache area and a work area and an ECC (Error Checking and Correcting) circuit 2B.

The RAM 2A is constructed by a volatile RAM such as a DRAM (Dynamic Random Access Memory) and a SRAM (Static Random Access Memory) or a nonvolatile RAM such as a MRAM (Magnetoresistive Random Access Memory), a FeRAM (Ferroelectric Random Access Memory), a ReRAM (Resistance Random Access Memory), and a PRAM (Phase-change Random Access Memory).

During the data write, the ECC circuit 2B generates an error correction code with respect to write data, and the SSD controller 2 transmits the write data to NAND flash memory 3 with the error correction code added to the write data. During the data read, the ECC circuit 2B performs error detection (error bit detection) and error correction to read data using the error correction code included in the read data. For example, a Bose-Chaudhuri-Hocquenghem (BCH) code, a Reed-Solomon (RS) code, and a Low-Density Parity-Check (LDPC) code are used in ECC coding or ECC decoding of the ECC circuit 2B. The ECC circuit 2B may be a CRC circuit that performs the error detection using a Cyclic Redundancy Check (CRC) code.

FIG. 2 is a block diagram illustrating a configuration of the NAND flash memory 3. The NAND flash memory 3 includes at least a NAND memory chip 20. FIG. 3 is a block diagram illustrating a configuration of the NAND memory chip 20.

Memory cells in each of which the data can electrically be rewritten are two-dimensionally arrayed in memory cell array 22. Plural bit lines, plural word lines, and a common source line are provided in the memory cell array 22. The memory cell is disposed in an intersection area of the bit line and the word line.

A word line control circuit 25 that is of a row decoder is connected to the plural word lines to select and drive the word line in reading, writing, and erasing the data. A bit line control circuit 23 is connected to the plural bit lines to control the voltage at the bit line in reading, writing, and erasing the data.

The bit line control circuit 23 senses the data of the bit line during the data read, and applies the voltage corresponding to the write data to the bit line during the data write. According to an address, a column decoder 24 generates a column select signal in order to select the bit line, and transmits the column select signal to the bit line control circuit 23.

The read data read from the memory cell array 22 is externally output from a data input/output terminal 28 through the bit line control circuit 23 and a data input/output buffer 29. The write data input to the data input/output terminal 28 from the outside is input to the bit line control circuit 23 through the data input/output buffer 29.

The memory cell array 22, the bit line control circuit 23, the column decoder 24, the data input/output buffer 29, and the word line control circuit 25 are connected to a control circuit 26. Based on the control signal input to a control signal input terminal 27 from the outside, the control circuit 26 generates a control signal and a control voltage in order to control the memory cell array 22, the bit line control circuit 23, the column decoder 24, the data input/output buffer 29, and the word line control circuit 25. In the NAND memory chip 20, the units except the memory cell array 22 are collectively referred to as a memory cell array control unit (a NAND controller) 21.

Figure 4:
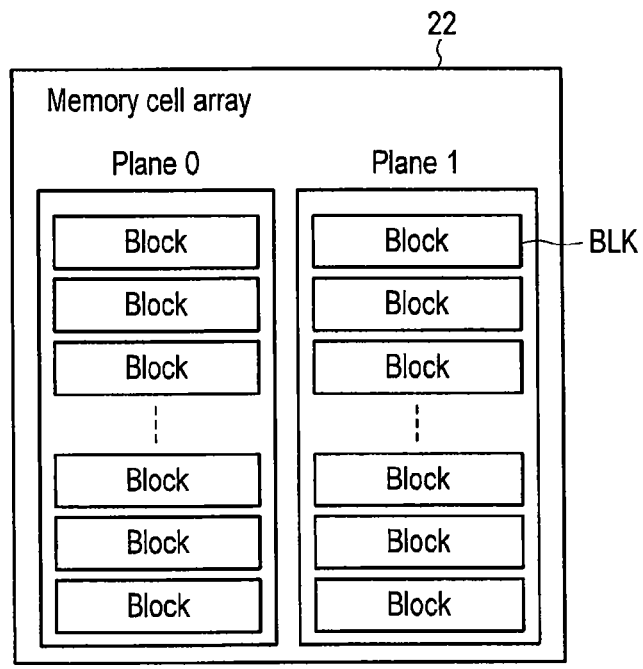
FIG. 4 is a block diagram of a memory cell array.

FIG. 4 is a block diagram illustrating a configuration of the memory cell array 22. The memory cell array 22 includes one or plural planes (or districts). FIG. 4 illustrates the case that the memory cell array 22 includes the two planes (plane 0 and plane 1). Each plane includes plural blocks BLK. Each block BLK is constructed by plural memory cells, and the data is erased in units of blocks BLK.

Figure 5:
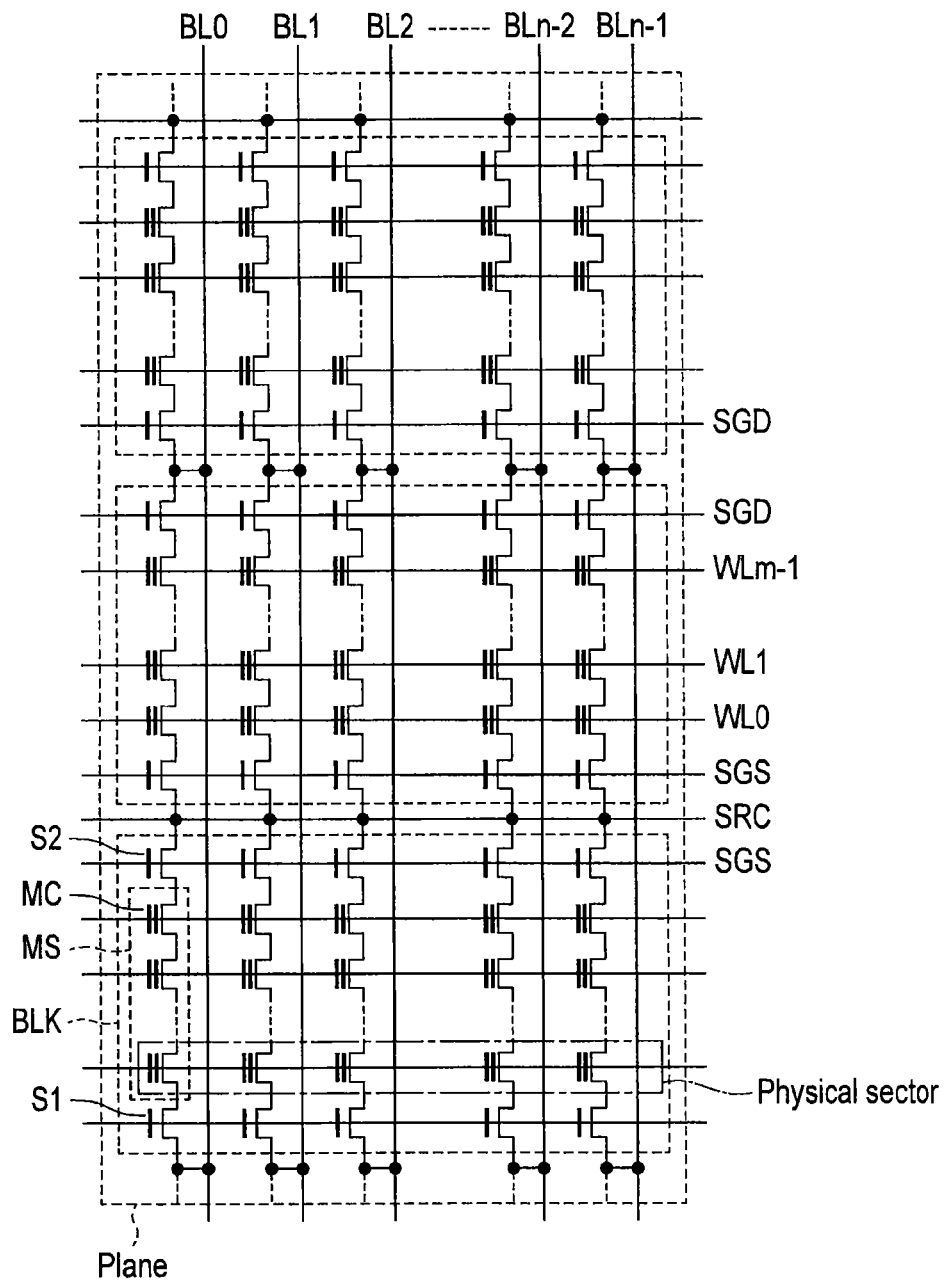
FIG. 5 is a circuit diagram of a plane included in the memory cell array.

FIG. 5 is a circuit diagram illustrating a plane included in the memory cell array 22. Each block BLK included in the plane includes plural NAND units. Each NAND unit is constructed by a memory string MS including plural series-connected memory cells MC and select gates S1 and S2 connected to both ends of the memory string MS. The select gate S1 is connected to a bit line BL, and the select gate S2 is connected to a common source line SRC. Control gates of the memory cells MC disposed in the same row are commonly connected to one of word lines WL0 to WLm−1. The select gates S1 are commonly connected to a select line SGD, and the select gates S2 are commonly connected to a select line SGS.

The memory cell (a memory cell transistor) is constructed by a MOSFET (Metal Oxide Semiconductor Field Effect Transistor) having a stacked gate structure formed on a P-type well of a semiconductor substrate. The stacked gate structure includes a charge storage layer (a floating gate electrode) that is formed on the P-type well with a gate insulating film interposed therebetween and a control gate electrode that is formed on the floating gate electrode with an inter-gate insulating film interposed therebetween. A threshold voltage of the memory cell changes according to the number of electrons accumulated in the floating gate electrode, and the data is stored in the memory cell according to a difference of the threshold voltage.

A four-level storage system, in which two bits per cell are stored in individual memory cell using an upper page and a lower page, is described in the first embodiment. However, an essence of the embodiment does not change even in a two-level storage system in which a bit per cell is stored in individual memory cell using a single page, an eight-level storage system in which three bits per cell are stored in individual memory cell using the upper page, a middle page, and the lower page, and a multi-level storage system in which at least four bits per cell are stored in individual memory cell. The memory cell is not limited to the floating gate electrode, but the memory cell may have a structure, such as a MONOS (Metal-Oxide-Nitride-Oxide-Silicon) type, in which the threshold voltage is changed by trapping the electrons in a nitride interface that is of the charge storage layer. Similarly the MONOS memory cell may be configured to store the bit or multi-level bits therein. A nonvolatile semiconductor memory in which the memory cells are three-dimensionally arrayed may be used as disclosed in U.S. Pat. No. 8,189,391, U.S. Patent Application No. 2010/0207195, U.S. Patent Application No. 2010/0254191.

The plural memory cells connected to a word line constitutes a physical sector. The data is written or read every physical sector. The physical sector can be defined irrespective of a logical sector of LBA (Logical Block Addressing) managed by the host device. A size of the physical sector may be identical to or different from that of the logical sector. The data for two pages is stored in a physical sector for the two-bit-per-cell (four-level) write system. The data for a page is stored in a physical sector for the a-bit-per-cell (two-level) write system, and the data for three pages are stored in a physical sector for the three-bit-per-cell (eight-level) write system.

During the read operation, the verify operation, and the write (program) operation, according to a physical address received from SSD controller 2 by the NAND controller 21, a word line is selected and a physical sector is selected. The pages in the physical sector are switched using the physical address. A row address can be cited as an example of the physical address. In the first embodiment, occasionally the write is expressed by the program, and the write and the program are the same in meaning. For the two-bit-per-cell write system, the SSD controller 2 deals with the physical sector to which the two pages of the upper page and lower page are assumed to be allocated, and the physical address is allocated to all the pages. The two-bit-per-cell write system is configured such that the threshold voltage in a memory cell can have distributions in four ways.

Figure 6:
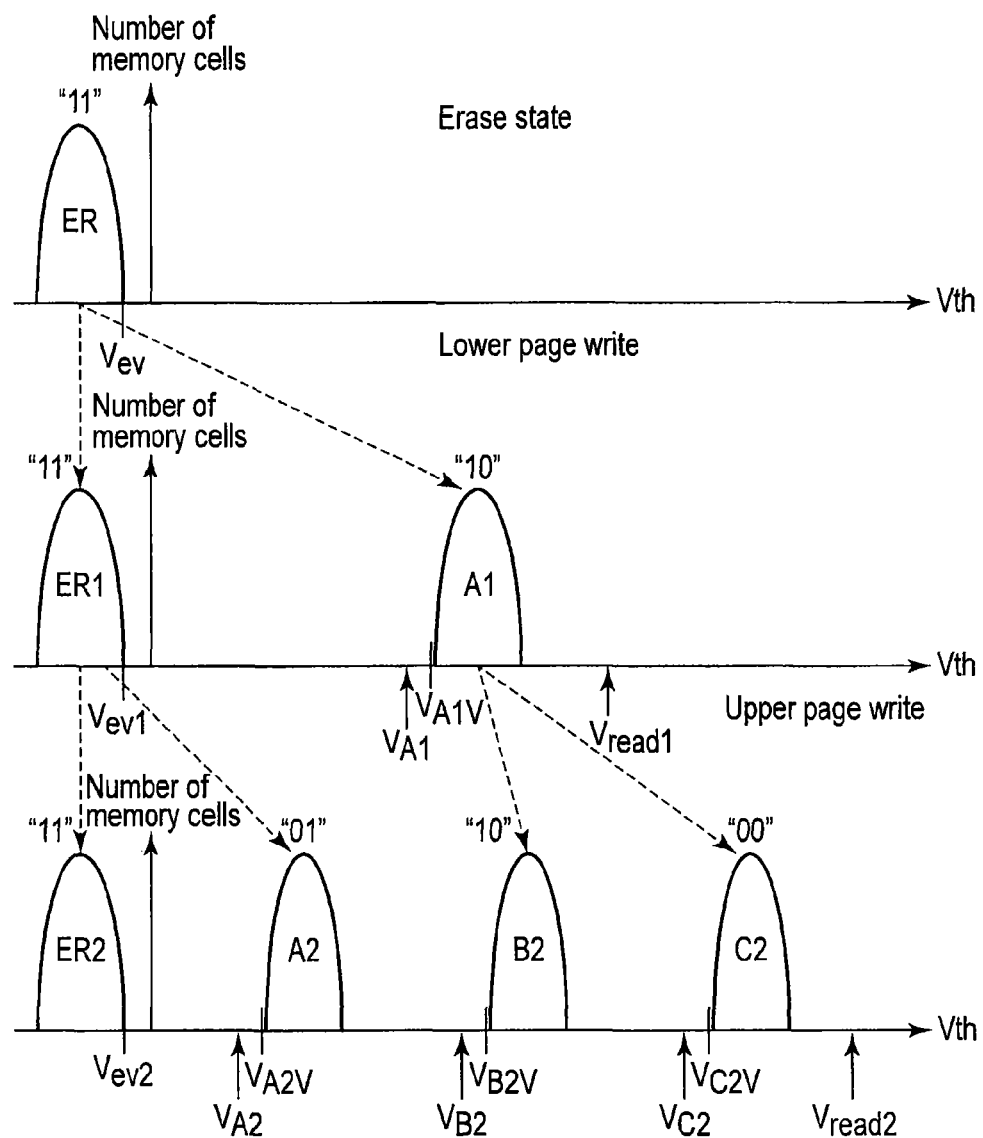
FIG. 6 is a view illustrating a relationship between two-bit data and a threshold voltage distribution of a memory cell.

FIG. 6 is a view illustrating a relationship between the two-bit data (pieces of data "11", "01", "10", and "00") and a threshold voltage distribution of the memory cell. A voltage $V_{A1}$ is applied to the selected word line, when two pieces of data are read from the physical sector in which the lower page is already written while the upper page is not written yet. A verify voltage $V_{A1N}$ is applied to the selected word line in order to check whether the write is completed, when the write is performed to a threshold voltage distribution A1.

Voltages $V_{A2}$, $V_{B2}$, and $V_{C2}$ are applied to the selected word line, when four pieces of data are read from the physical sector in which the lower page and the upper page are already written. Verify voltages $V_{A2V}$, $V_{B2V}$, and $V_{C2V}$ are applied to the selected word line in order to check whether the write is completed, when the write is performed to each threshold voltage distribution. Read voltages $V_{read1}$ and $V_{read2}$ are applied to an unselected memory cell in reading the data, and puts the unselected memory cell into a conduction state irrespective of written data.

Erase verify voltages $V_{ev}$, $V_{ev1}$, and $V_{ev2}$ are applied to the memory cell in order to check whether the erase is completed, when the data is erased from the memory cell. In the first embodiment, the erase verify voltages $V_{ev}$, $V_{ev1}$, and $V_{ev2}$ have negative values.

The verify voltage is determined in consideration of an influence of interference from the adjacent memory cell.

A magnitude relationship among the voltages is follows.
$V_{ev1} < V_{A1} < V_{A1V} < V_{read1}$
$V_{ev2} < V_{A2} < V_{A2V} < V_{B2} < V_{B2V} < V_{C2} < V_{C2V} < V_{read2}$ In the embodiment, the erase verify voltages $V_{ev}$, $V_{ev1}$, and $V_{ev2}$ have the negative values. However, in the actual erase verify operation, the voltage applied to the control gate of the memory cell is not the negative value but a positive value. That is, in the actual erase verify operation, the positive voltage is applied to the back gate of the memory cell, and the voltage of zero or the positive voltage less than the voltage at the back gate is applied to the control gate of the memory cell. In other words, the erase verify voltages $V_{ev}$, $V_{ev1}$, and $V_{ev2}$ are voltages having equivalently positive values.

In the first embodiment, after the block erase, a threshold voltage distribution ER of the memory cell has a negative upper limit, and the data "11" is allocated to the upper limit. The memory cells of the pieces of data "01", "10", and "00" in the states in which the lower page and the upper page are written have positive threshold voltage distributions A2, B2, and C2, respectively (lower limits of the threshold voltage distributions A2, B2, and C2 are positive values). The threshold voltage distribution A2 of the data "01" has the lowest voltage value, the threshold voltage distribution C2 of the data "00" has the highest voltage value, and the voltage values of the threshold voltage distribution A2, B2, and C2 have a relationship of A2<B2<C2. The memory cell of the data "10" in the state in which the lower page is written while the upper page is not written has the positive threshold voltage distribution A1 (the lower limit of the threshold voltage distribution A1 is also the positive value).

FIG. 6 illustrates the threshold voltage distribution only by way of example, but the first embodiment is not limited to the threshold voltage distribution in FIG. 6. For example, in FIG. 6, the threshold voltage distributions A2, B2, and C2 are the positive threshold voltage distributions. However, the case that the threshold voltage distribution A2 is the negative threshold voltage distribution while the threshold voltage distributions B2 and C2 are the positive threshold voltage distributions is also included in the scope of the first embodiment. Even if the threshold voltage distributions ER1 and ER2 are the positive values, the first embodiment is not limited to the positive threshold voltage distributions ER1 and ER2. In the first embodiment, the pieces of data of the threshold voltage distributions ER2, A2, B2, and C2 have a correspondence relationship of "11", "01", "10", and "00". Alternatively, for example, the pieces of data of the threshold voltage distributions ER2, A2, B2, and C2 may have another correspondence relationship of "11", "01", "00", and "10".

The two-bit data of a memory cell is constructed by the lower page data and the upper page data, and the lower page data and the upper page data are written to the memory cell by individual write operation, namely, the two-time write operation. In the case that the data is expressed by "XY", "X" expresses the upper page data and "Y" expresses the lower page data.

The write of the lower page data will be described with reference to FIG. 6. The lower page data is written based on the write data (the lower page data) input to the NAND controller 21 from the SSD controller 2. The memory cell in the erase state has the threshold voltage distribution ER in the erase state, and the data "11" is stored in the memory cell. When the NAND controller 21 writes the lower page data to the memory cell in the erase state, the threshold voltage distribution ER of the memory cell is divided into the two threshold voltage distributions ER1 and A1 according to the value ("1" or "0") of the lower page data. In the case that the lower page data is the data "1", the NAND controller 21 prevents an increase in threshold voltage Vth of the memory cell such that a high electric field is not applied to a tunnel oxide film of the memory cell. As a result, the threshold voltage distributions ER1 is equal to the threshold voltage distributions ER because the threshold voltage distribution ER in the erase state is maintained. Alternatively, the threshold voltage distributions ER1 may be greater than the threshold voltage distributions ER.

On the other hand, in the case that the lower page data is the data "0", the NAND controller 21 applies the high electric field to the tunnel oxide film of the memory cell to inject the electrons to the floating gate electrode, thereby increasing the threshold voltage Vth of the memory cell by a predetermined amount. Specifically, the NAND controller 21 sets the verify voltage $V_{A1V}$, and repeats the write operation until the threshold voltage becomes the verify voltage $V_{A1V}$ or more. As a result, the memory cell changes to the written state (the data "10"). In the case that the threshold voltage does not reach a predetermined threshold voltage even if the write operation is repeated predetermined times (or in the case that the number of memory cells that do not reach the predetermined threshold voltage is greater than or equal to a predetermined value), the write performed to the physical page becomes a "write error" ("program error"), and the NAND controller 21 notifies the SSD controller 2 of the write error.

The write of the upper page data will be described with reference to the second and third stages of FIG. 6. The upper page data is written based on the write data (the upper page data) input to the NAND controller 21 from the SSD controller 2 and the lower page data already written in the memory cell.

In the case that the upper page data is the data "1", the NAND controller 21 prevents the increase in threshold voltage Vth of the memory cell such that the high electric field is not applied to the tunnel oxide film of the memory cell. As a result, the memory cell of the data "11" (the threshold voltage distribution ER1 in the erase state) maintains the data "11" (the threshold voltage distribution ER2), and the memory cell of the data "10" (the threshold voltage distribution A1) maintains the data "10" (the threshold voltage distribution B2). However, in order to ensure a voltage margin between the distributions, desirably the NAND controller 21 adjusts the lower limit of the threshold voltage distribution using the positive verify voltage $V_{B2V}$ greater than the verify voltage $V_{A1V}$, thereby forming the threshold voltage distribution B2 in which the threshold voltage distribution is narrowed. In the case that the threshold voltage does not reach a predetermined threshold voltage even if the NAND controller 21 repeats the adjustment of the lower limit predetermined times (or in the case that the number of memory cells that do not reach the predetermined threshold voltage is greater than or equal to a predetermined value), the write (the program operation) performed to the physical page becomes the "write error" ("program error"), and the NAND controller 21 notifies the SSD controller 2 of the write error.

On the other hand, in the case that the upper page data is the data "0", the NAND controller 21 applies the high electric field to the tunnel oxide film of the memory cell to inject the electrons to the floating gate electrode, thereby increasing the threshold voltage Vth of the memory cell by a predetermined amount. Specifically, the NAND controller 21 sets the verify voltages $V_{A2V}$ and $V_{C2V}$, and repeats the write operation until the threshold voltage becomes the verify voltages $V_{A2V}$ and $V_{C2V}$ or more. As a result, the memory cell of the data "11" (the threshold voltage distribution ER1 in the erase state) changes to the data "01" of the threshold voltage distribution A2, and the memory cell of the data "10" (the threshold voltage distribution A1) changes to the data "00" of the threshold voltage distribution C2. In the case that the threshold voltage does not reach a predetermined threshold voltage even if the NAND controller 21 repeats the write operation predetermined times (or in the case that the number of memory cells that do not reach the predetermined threshold voltage is greater than or equal to the predetermined value), the write performed to the physical page becomes the "write error" ("program error"), and the NAND controller 21 notifies the SSD controller 2 of the write error.

In the erase operation, the NAND controller 21 sets the erase verify voltage $V_{ev}$, and repeats the erase operation until the threshold voltage becomes the erase verify voltage $V_{ev}$ or less. As a result, the memory cell changes to the erase state (the data "11"). In the case that the threshold voltage does not reach a predetermined threshold voltage even if the NAND controller 21 repeats the erase operation predetermined times (or in the case that the number of memory cells that do not reach the predetermined threshold voltage or less is greater than or equal to a predetermined value), the erase performed to the physical page becomes an "erase error", and the NAND controller 21 notifies the SSD controller 2 of the erase error.

An example of the data writing method in the four-level storage system is described above. The multi-level storage system in which at least three bits per cell are written is the same in the basic operation, because only an operation to divide the threshold voltage distribution into at least eight ways is added to the above operation according to the further upper page data.

(Read Disturb)

As described above, in the case that the SSD controller 2 reads the data from the NAND flash memory 3, the NAND controller 21 applies the read voltages $V_{read1}$ and $V_{read2}$ to the unselected memory cell, and puts the unselected memory cell into the conduction state irrespective of the written data of the unselected memory cell to read the selected memory cell. Desirably the read voltages $V_{read1}$ and $V_{read2}$ are determined as a design parameter of the NAND controller 21 during development so as to be large enough to put the unselected memory cell into the conduction state and so as to be small enough not to rewrite the written data of the unselected memory cell, or the read voltages $V_{read1}$ and $V_{read2}$ are written as a production parameter of the NAND memory chip 20 in a ROM FUSE area of the NAND memory chip 20 during the production.

In the case that the read is performed to the same block many times, the electric field is applied to the tunnel oxide film of the memory cell many times. As a result, the electrons are injected to the floating gate electrode of the unselected memory cell to shift the threshold voltage, and possibly the written data of the unselected memory cell is lost. The fluctuation in threshold voltage of the unselected memory cell during the read operation is referred to as read disturb, and the data breakage of the unselected memory cell due to the read disturb is referred to as a read disturb failure (a read disturb error). A failure rate of the read disturb failure is susceptible to the state of the tunnel oxide film or floating gate electrode of the memory cell, and the failure rate fluctuates largely depending on the block or NAND memory chip. Therefore, it is necessary that the block having a high read disturb failure rate be detected and marked as a bad block before the shipment of the SSD, and that the SSD controller 2 be prevented from accessing the bad block. Desirably the SSD having the high read disturb failure rate is determined to be a defective product, and is not shipped.

[2. Operation of SSD 1]

Various operations of the SSD 1 will be described below. A start-up sequence of the SSD 1 will be described.

The firmware stored in the FW area 3a of the NAND flash memory 3 can perform at least two modes, namely, a normal mode and a self-running mode (a self-test mode). The normal mode is one that performs an operation in response to an instruction of a user or the host device 10. The normal mode includes the usual read operation, write operation, and erase operation. The self-running mode is one in which the SSD 1 automatically performs a specific operation without receiving an instruction from the outside of the SSD 1. The SSD controller executes the firmware for the self-running mode to perform the specific operation.

FIG. 7 is a flowchart illustrating the start-up sequence (a power-on sequence) of the SSD 1. An external voltage is supplied to the SSD 1 from the outside through the power supply line 12. The power supply unit 5 supplies various voltages to the power supply lines 7a to 7c (Step S100). When the power supply line 7a reaches a predetermined voltage (Yes in Step S101), the SSD controller 2 starts up (Step S102).

The SSD controller 2 reads the firmware stored in the FW area 3a of the NAND flash memory 3 (Step S103). When the firmware read from the FW area 3a is in the normal mode state (Yes in Step S104), the SSD controller 2 performs the normal mode based on the firmware. When the firmware read from the FW area 3a is in the self-running mode state (Yes in Step S105), the SSD controller 2 performs the self-running mode based on the firmware. When the FW area 3a is in another mode state except the normal mode and self-running mode (No in Step S104 and No in Step S105), the SSD controller 2 performs another mode according to the firmware.

For example, firmware dedicated to the normal mode and firmware dedicated to the self-running mode may be used. The host device 10 and a later-described test device 100 switch between the firmware dedicated to the normal mode and the firmware dedicated to the self-running mode by rewriting the firmware stored in the FW area 3A through the interface 11. For example, when the host device 10 or the test device 100 transmits a 92h DOWNLOAD MICROCODE command or a 93h DOWNLOAD MICROCODE DMA command, which is a command compliant with an INCITS ACS-3 described in ATA/ATAPI Command Set-3 (ACS-3) (http://www.t13.org/), and a firmware image dedicated to the self-running mode to the SSD controller 2, the SSD controller 2 rewrites the firmware dedicated to the normal mode stored to the FW area 3A as the firmware dedicated to the self-running mode. For example, when the host device 10 or the test device 100 transmits the 92 h DOWNLOAD MICROCODE command or the 93 h DOWNLOAD MICROCODE DMA command and the firmware image dedicated to the normal mode to the SSD controller 2, the SSD controller 2 rewrites the firmware dedicated to the self-running mode stored to the FW area 3A as the firmware dedicated to the normal mode. Alternatively, the firmware may be rewritten using an SCT command compliant with INCITS ACS-3 or a vendor unique command.

Alternatively, common firmware may be used in the normal mode and the self-running mode. In this case, in addition to the firmware, trigger information is stored in the FW area 3a. The trigger information indicates which the normal mode or the self-running mode the firmware should be performed. When reading the firmware during the start-up sequence, the SSD controller 2 reads the trigger information from the FW area 3a, and performs the firmware in one of the normal mode and the self-running mode. The SSD controller 2 can rewrite the trigger information to set the mode that should be performed in the next start-up sequence. The host device 10 or the test device 100 can make a request to the SSD controller 2 to rewrite the trigger information using, for example, the SCT command compliant with INCITS ACS-3 or the vendor unique command.

[3. Screening Operation]

A test method (the screening operation) of the first embodiment will be described below. When the self-running mode is started, the SSD controller 2 performs the screening operation to the NAND flash memory 3 (NAND screening). In the NAND screening, the NAND flash memory 3 is aged (worn out) by repeating the erase, program, and write of the block, and a block failure that possibly becomes an initial failure is detected before shipment (reliability acceleration). The SSD controller 2 marks the block, in which failures such as the erase error, the write error, and an uncorrectable ECC error (a read error) are detected, as the bad block (registers the block in the bad block management table 3D), thereby previously preventing the user from using the block that possibly causes the failure in the future. The SSD controller or the test device 100 determines the SSD having many failures, and reports or records a test result such that the SSD is not shipped. Therefore, the user is previously prevented from using the SSD having the high failure rate.

Because the host device 10 is not required during the NAND screening in which the SSD 1 is operated in the self-running mode, desirably only a power supply device 40 is connected to the SSD 1 as illustrated in FIG. 8 from the viewpoint of reducing cost of a NAND screening apparatus. Specifically, the SSD 1 is connected to the power supply device 40 through the power supply line 12. The interface 11 is not connected to the outside. Thus, the NAND screening can be performed only by preparing the inexpensive power supply device 40 as the external power supply for the SSD 1.

As illustrated in FIG. 9, desirably the screening is performed to the plurality of SSDs 1 with the same equipment from the viewpoint of improving the cost and throughput of the test process (a processing capacity of the test process). The plurality of SSDs 1 is connected to the power supply device 40 through power supply lines 12. The plurality of SSD 1 and the power supply device 40 are accommodated in a thermostatic chamber 41. An inside of the thermostatic chamber 41 can be set to a predetermined temperature. When the plurality of SSDs 1 are screened in parallel using the power supply device 40 and the thermostatic chamber 41, the screening cost can be reduced while a screening time is shortened. Because the plurality of SSDs 1 can be screened with the single equipment, an equipment occupied area of a factory is also reduced.

Desirably the SSD controller 2 notifies the power supply device 40 of the state or result of the screening through a signal line in the power supply line 12. In the first embodiment, a DAS/DSS (Device Activity Signal/Disable Staggered Spinup) signal line in the power supply line 12 is used as the signal line through the SSD controller 2 notifies the power supply device 40 of the state or result of the screening. For example, the DAS/DSS signal line is electrically connected to an LED 42. The SSD controller 2 can notify the operator who manufactures the SSD 1 of the state or result of the screening by controlling the LED 42 through the DAS/DSS signal line. Alternatively, the thermostatic chamber 41 may electrically process the signal received from the DAS/DSS signal line, and display the state or result of the screening of the SSD 1 on, for example, a liquid crystal display connected to the thermostatic chamber 41. The operator may be either a human or a machine.

FIG. 10A is a flowchart illustrating the screening operation of the SSD 1. When the self-running mode is started, the SSD controller 2 performs the screening.

The SSD controller 2 clears a list used to manage the block to which the screening process is already performed (a processed list) (Step S300). The processed list is stored in the RAM 2A of the SSD controller 2, or may be stored in the management information area 3B of the NAND flash memory 3. The SSD controller 2 selects a block from the user area 3C of the NAND flash memory 3 (Step S301). For example, (1) the block having a block address of 0 is selected after the self-running mode is started, and then the block may sequentially be selected by repeatedly incrementing the block address by 1, or (2) the block may randomly be selected. As to the method for randomly selecting the block, for example, the SSD controller 2 creates a block address list in which the block addresses are randomly arrayed, selects the block at a head of the block address list after the self-running mode is started, and sequentially selects the block by repeatedly incrementing the number of lines of the lock address list by 1.

(Pre-Read)

In order to efficiently screen (test) the failure block or the failure NAND memory, desirably the SSD controller 2 performs pre-erase read called pre-read to the selected block between the block selection in Step S301 and the erase operation in Step S303 (Step S302). Although the flow may go to the erase operation in Step S303 without performing the pre-read operation in Step S302, desirably the pre-read operation in Step S302 is performed in order to enhance a failure detection rate. Step 302 can detect a failure in which data of a certain block is lost during access to another block. A failure of a peripheral circuit of the memory cell array 22 and a wiring failure can be cited as an example of the failure.

For example, occasionally the data is falsely written to the block (a test completed block) in which the process is already performed in a certain loop (cycle) by accessing to another block in the same or subsequent loop (a false write failure). Unless the pre-read is performed, the process performed to the falsely-written block is started from the data erase in the subsequent loop to erase the falsely-written data. Therefore, the false write cannot be detected. On the other hand, the falsely-written block can be detected when the pre-read is performed.

For example, occasionally the data is falsely erased from the block in which the process is already performed in a certain loop by accessing to another block in the same or subsequent loop (a false erase failure). Unless the pre-read is performed, the process performed to the falsely-erased block is started from the data erase in the subsequent loop, and block erase and data write are performed before the data read. Therefore, the false erase cannot be detected. On the other hand, the falsely-erased block can be detected when the pre-read is performed.

For example, a given time interval is provided until the data is erased by the processes in Steps S301 to S306 to a certain block since the data is written to another block in Step S304, the data is read again by the pre-read before the data is erased, and the block having poor data retention may be screened as the defective product.

In the pre-read, the SSD controller 2 reads the data from a certain page in the selected block, and performs the error detection to the read data using the ECC circuit 2B. In the first embodiment, the SSD controller 2 performs the error detection to the read data using the error correction function of the ECC circuit 2B. The SSD controller 2 performs the string of processes to all the pages. For example, in the case that the read data of a page of the selected block is uncorrectable, or in the case that a correctable error bit count correctable error bit count is greater than a predetermined value, the SSD controller 2 determines that the block is the failure block. Desirably the SSD controller 2 marks the failure block as the bad block.

In the case that the read error happens in the pre-read, as described above, the read error has a possibility of the false write failure or the false erase failure. A pre-read failure has a possibility of the wiring failure, such as a wiring short circuit, which happens in the NAND controller 21 and the wiring connected to the NAND controller 21. Even if the SSD controller 2 marks the block in which the pre-read failure happens as the bad block, possibly the pre-read failure happens again in another block. Therefore, in the case that the failure happens in the pre-read, desirably the SSD controller 2 determines that the failure cannot be saved only by marking the SSD 1 as the bad block, and notifies the operator who is in charge of producing the SSD 1 of a failure content through the LED 42 or the test device 100. Therefore, the operator who is in charge of the production of the SSD 1 can discard or reject the SSD 1 to prevent a field failure. Alternatively, in the case that the pre-read failure happens, the SSD 1 may be re-manufactured by replacing the NAND memory chip 20 in which the pre-read failure happens for the new NAND memory chip 20.

In the case that the data is uncorrectable, or in the case that the block in which the correctable error bit count is greater than the predetermined value exists, the SSD 1 may be regarded as the defective product to instantly end the screening process. Desirably the SSD controller 2 stops the loop to terminate the screening immediately to blink the LED 42 at high speed, thereby notifying the outside that the screening is abnormally ended because the SSD 1 is the defective product.

In reading the data of the block, the order in which the physical pages of the block are read is described later.

Figure 10:
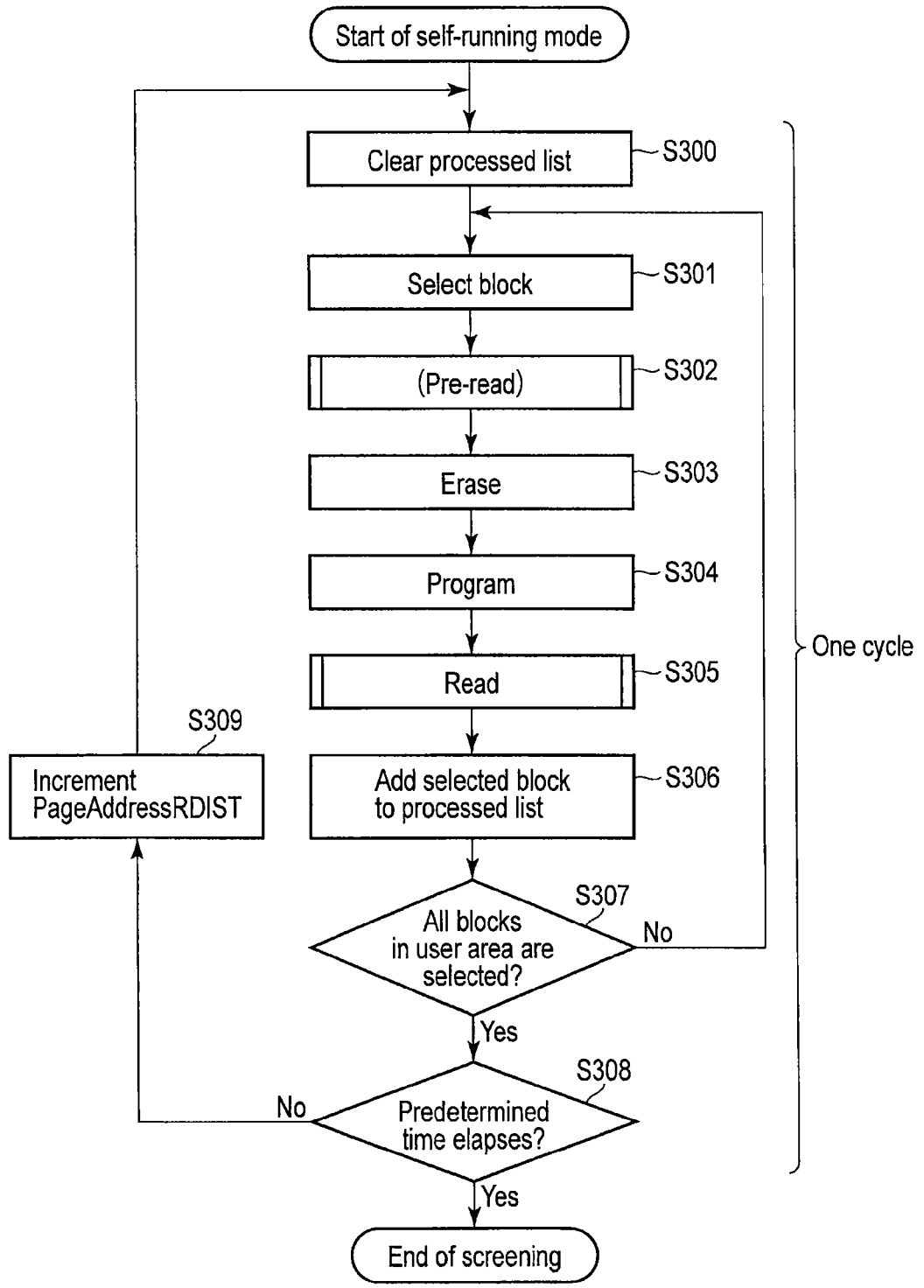
FIG. 10 is a flowchart illustrating a screening operation of the first embodiment.

For example, the first embodiment is effectively implemented even if the pre-read operation in Step S302 is not performed in FIG. 10. Although the effect of the first embodiment is sufficiently exerted even if the pre-read operation is not performed, desirably the pre-read operation is performed from the viewpoint of improving the failure detection rate.

The pre-read operation in Step S302 may be different from the read operation in S305. For example, the SSD controller 2 performs a read disturb failure detection process in the read operation in S305, and may sequentially read the pages from the page 0 to the ending page in the pre-read operation.

As illustrated in FIG. 10A, the SSD controller 2 may not perform the read operation in Step S305 but performs the read disturb failure detection process in the pre-read operation in Step S302.

(Erase)

Then the SSD controller 2 erases the data of the selected block (Step S303). The SSD controller 2 marks the block that becomes the erase error in Step S303 as the bad block.

(Program)

Then the SSD controller 2 programs the data in the selected block (Step S304). In the program operation in Step S304, both main body data and a spare bit for ECC are programmed in the selected block. In order to evenly apply a stress to the memory cells, and in order to evenly perform the screening, desirably the SSD controller 2 generates a random number sequence as the main body data used in the program process. More desirably the SSD controller 2 generates the random number sequence used in the main body data using different seed values every step or every loop. The SSD controller 2 performs the program process to all the pages (including the lower page and the upper page) of the selected block. The SSD controller 2 marks the block that becomes the write error in Step S304 as the bad block.

(Read)

Then the SSD controller 2 reads the data from the selected block (Step S305). In the read processes in Steps S302 and S305, the SSD controller 2 performs error detection of the main body data using the ECC code. In the first embodiment, the SSD controller 2 performs the error detection to the read data using the error correction function of the ECC circuit 2B. In the case that the correctable error bit count is greater than the predetermined value, the SSD controller 2 determines that the selected block is the read error. In order to more surely mark the block having the low reliability as the bad block, desirably the SSD controller 2 marks the block in which the read error happens as the bad block. On the other hand, the SSD controller 2 may not mark the block in which the read error happens as the bad block which the SSD controller 2 marks the block in which the erase error and the write error happen as the bad block.

Figure 11:
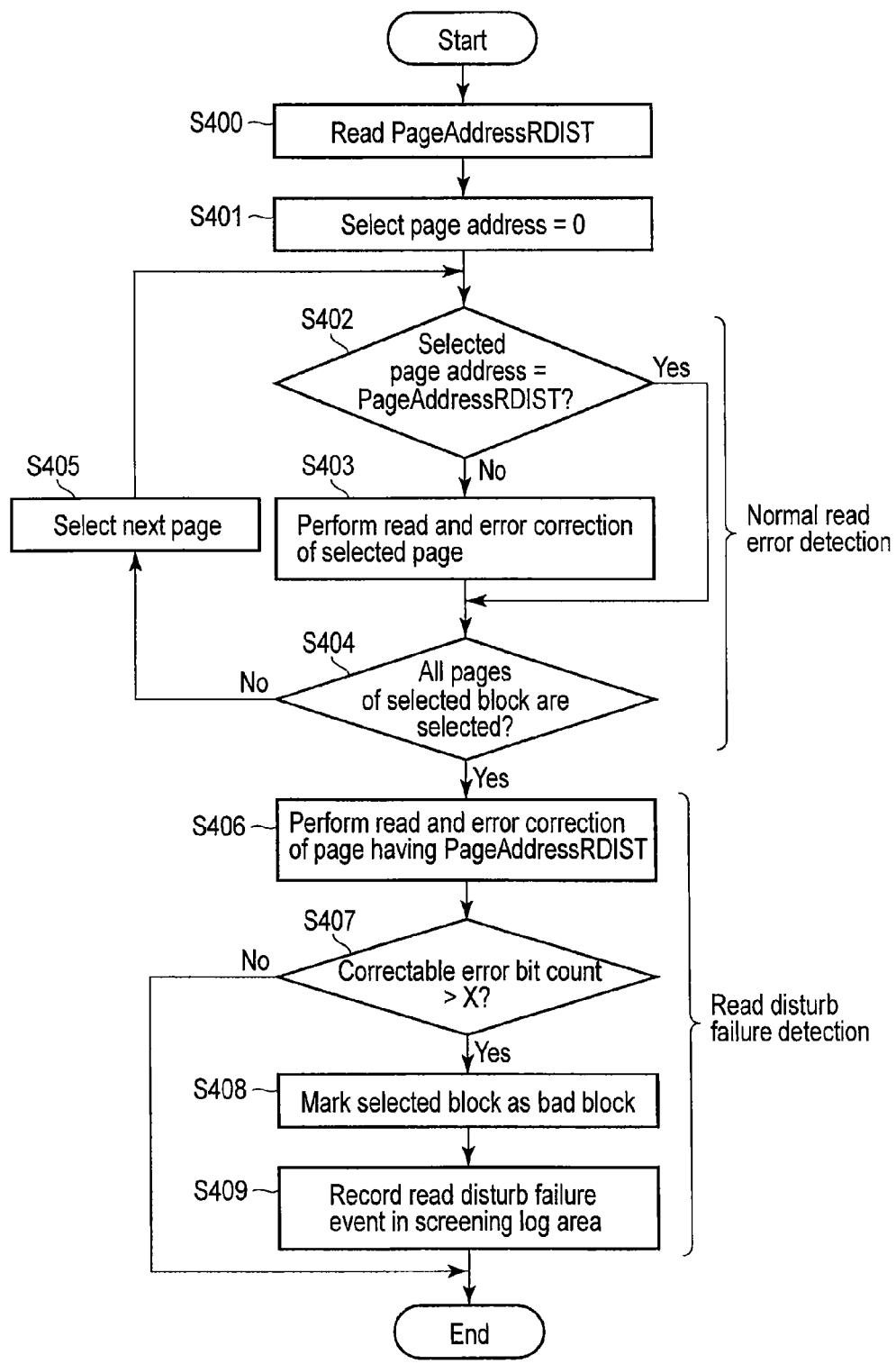
FIG. 11 is a flowchart illustrating a read operation.
Figure 12:
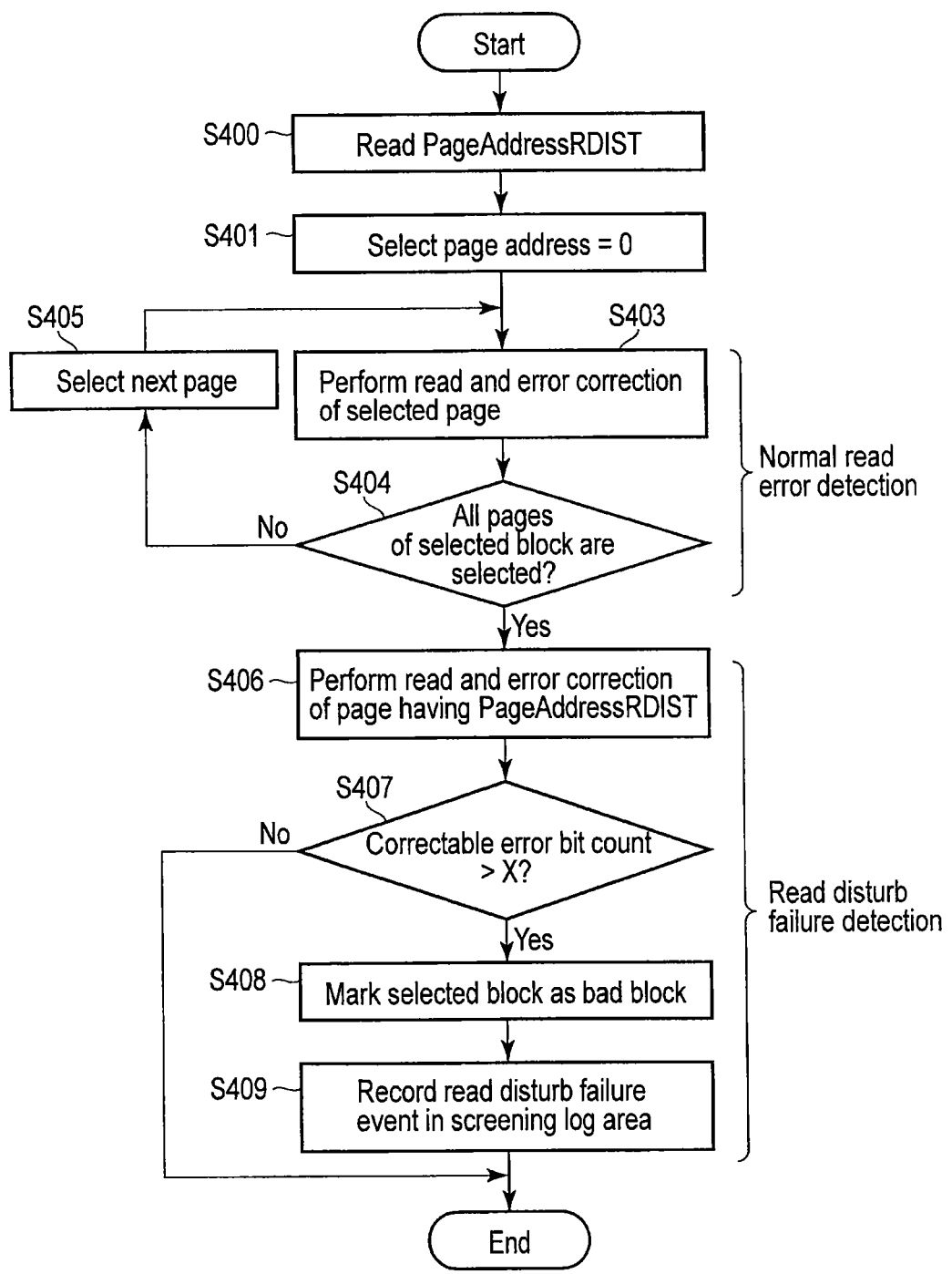
FIG. 12 is a flowchart illustrating the read operation.

FIGS. 11 and 12 are flowcharts illustrating the read operation in Step S305. One of the read operations in FIGS. 11 and 12 is used as the read process in S305. The read operations in FIGS. 11 and 12 can also be applied to the pre-read operation in S302.

One of the features of the first embodiment is that an address (hereinafter referred to PageAddressRDIST) of the physical page of a read disturb failure detection target stored in the RAM (or the RAM connected to the SSD controller 2 or the management information area 3B of the NAND flash memory 3) of the SSD controller 2, and one of the features of the read operation in the first embodiment is that the SSD controller 2 performs the read and error correction to the physical page having the PageAddressRDIST after performing the read and error correction to the physical pages except the physical page having the PageAddressRDIST in all the physical pages of the selected block. In order to efficiently screen the read disturb failure to all the pages and all the blocks, desirably the value of the PageAddressRDIST is changed every selected block or every cycle (loop) in Steps S300 to S308.

The SSD controller 2 may use a plurality of different PageAddressRDISTs. In this case, the SSD controller 2 reads the block while avoiding the plurality of pages assigned by the plurality of PageAddressRDISTs, and then reads the avoided pages. In order to evenly perform disturb failure detection to all the memory cells at high speed, for example, the SSD controller 2 may restrict the PageAddressRDIST to such the lower page as the PageAddressRDISTs of 0, 1, 3, 5, 7, 9, . . . to select the PageAddressRDIST in Step S405 or, for example, the SSD controller 2 may restrict the PageAddressRDIST to such the upper page as the PageAddressRDISTs of 2, 4, 6, 8, 10, 12, . . . to select the PageAddressRDIST in Step S405.

Alternatively, the SSD controller 2 may perform the read disturb failure detection in Steps S406 to S408 to not the single page but the plurality of pages every read operation in Step S305. That is, for example, in the first cycle, the SSD controller 2 selects the plurality of PageAddressRDISTs of 0, 1, 3, . . . , 15 and performs the read disturb failure detection to the plurality of PageAddressRDISTs in Steps S406 to S408. In the second cycle, the SSD controller 2 selects the plurality of PageAddressRDISTs of 16, 17, 18, 19, . . . , 31 performs the read disturb failure detection to the plurality of PageAddressRDISTs in Steps S406 to S408.

In the first embodiment, the SSD controller 2 sets the PageAddressRDIST to 0 as an initial value at the beginning of the self-running mode, increments the PageAddressRDIST by 1 every loop (Step S309). In the case that the incremented PageAddressRDIST is greater than the maximum value of the page address, the SSD controller 2 resets the PageAddressRDIST to 0.

The SSD controller 2 reads the PageAddressRDIST stored in the RAM of the SSD controller 2 (Step S400). The SSD controller 2 selects the page address of 0 (Step S401).

In the flowchart in FIG. 11, the SSD controller 2 compares the selected page address to the PageAddressRDIST (Step S402). When the selected page address is not equal to the PageAddressRDIST (No in Step S402), the SSD controller 2 reads the selected page to perform the error detection process (Step S403).

In the first embodiment, the SSD controller 2 performs the error detection to the read data using the error correction function of the ECC circuit 2B. In the case that the correctable error bit count is greater than the predetermined value, or in the case that the error correction cannot be performed, desirably the SSD controller 2 marks the selected block as the bad block. Alternatively, in the case that the correctable error bit count is greater than the predetermined value, or in the case that the error correction cannot be performed, desirably the SSD controller 2 terminates the screening immediately to blink the LED 42 at high speed, thereby notifying the operator that the screening is abnormally ended because the SSD 1 is the defective product.

When the selected page address is equal to the PageAddressRDIST (Yes in Step S402), the SSD controller 2 skips the selected page reading process in Step S403. After other pages are read in the selected block (Steps S401 to S405), the SSD controller 2 performs the process of reading the skipped page having the PageAddressRDIST (Step S406).

To enhance the detection rate of a read disturb failure of the PageAddressRDIST in the step S406, the SSD controller may shift the Vread1 and the Vread2 applied to the cells of the PageAddressRDIST in the step S403 to a higher level than a normal read operation so that the impact of the read disturb to the PageAddressRDIST is accelerated during the step S403.

In the flowchart in FIG. 12, the SSD controller 2 does not compare the selected page address to the PageAddressRDIST, but reads all the pages of the block in Step S403 (Step S402 does not exist). In the flowchart in FIG. 12, the page is read to detect the uncorrectable ECC error in Step S403 in which the influence of the read disturb is relatively small, and the page is read again to detect the read disturb failure in Step S406 in which the influence of the read disturb is larger, which allows the read disturb failure to be more clearly distinguished from the uncorrectable ECC error.

To enhance the detection rate of a read disturb failure of the PageAddressRDIST in step S406, the SSD controller may shift the Vread1 and the Vread2 applied to the cells of the PageAddressRDIST in the step S403 to a higher level than a normal read operation so that the impact of the read disturb to the PageAddressRDIST is accelerated during the step S403.

Then, in both the flowcharts in FIGS. 11 and 12, the SSD controller 2 checks whether the selection is completed to all the pages in the selected block (Step S404). When the selection is not completed to all the pages (No in Step S404), the SSD controller 2 increments the address of the page to select the next page (Step S405). The processes in Steps S402 to S404 are performed to the selected page, and then all the pages of the selected block are selected.

When the selection is completed to all the pages (Yes in Step S404), the SSD controller 2 selects the page having the PageAddressRDIST again to perform the read process and the error detection process (Step S406). Because the page having the PageAddressRDIST is read after other pages are read, the page having the PageAddressRDIST is affected by the read disturb from all the pages of the selected block. Therefore, the memory cell easily affected by the read disturb can efficiently be screened.

Then the SSD controller 2 determines whether the correctable error bit count of the page having the PageAddressRDIST is greater than a predetermined value X, or determines whether the error correction is unsuccessfully performed (Step S407). When the correctable error bit count of the page having the PageAddressRDIST is less than or equal to the predetermined value X, or when the error correction is successfully performed (No in Step S407), the SSD controller 2 determines that the read disturb has a little influence on the page having the PageAddressRDIST, and normally ends the read process.

When the correctable error bit count of the page having the PageAddressRDIST is greater than the predetermined value X, or when the error correction is unsuccessfully performed (Yes in Step S407), the SSD controller 2 determines that the page having the PageAddressRDIST is the read disturb failure (the read disturb error). When the page having the PageAddressRDIST is the read disturb failure (Yes in Step S407), because the selected block possibly has the high failure rate of the read disturb failure, the SSD controller 2 marks the selected block as the bad block (Step S408). That is, the SSD controller 2 adds the selected block to the bad block management table 3D of the management information area 3B. The SSD controller 2 manages the bad block management table 3D to prevent the block that becomes the bad block from being used to write the data therein. The SSD controller 2 records a read disturb failure event in the screening log area 3E (Step S409).

When the correctable error bit count of the page having the PageAddressRDIST is greater than the predetermined value X, or when the error correction cannot be performed, the SSD controller 2 mat be determine that the SSD 1 is the defective product. For example, when the correctable error bit count of the page having the PageAddressRDIST is greater than the predetermined value X, or when the error correction cannot be performed, desirably the SSD controller 2 terminates the screening immediately to blink the LED at high speed, thereby notifying the outside that the screening is abnormally ended because the SSD 1 is the defective product.

In the case that the flowchart in FIG. 12 is used with respect to the read operation in Step S305, desirably the SSD controller 2 does not record the error event in Step S407 of the page having the PageAddressRDIST as the read disturb failure event in the screening log area 3E when determining that the page having the PageAddressRDIST is the read error in both Step S403 in the normal read error detection and Step S407 in the read disturb failure detection. Therefore, the read disturb failure and the uncorrectable ECC error can more clearly be distinguished from each other. Even if the SSD controller 2 records the read disturb failure event in Step S407 of the page having the PageAddressRDIST in the screening log area 3E, the test device 100 can determine whether the failure in question is the real read disturb failure or the read error except the read disturb failure, and the false detection can be prevented.

When the read error is detected in the read operation in Step S403 in the normal read error detection, the SSD controller 2 may skip the processes from Step S305 relating to the selected block after recording the error event in the screening log area 3E. The SSD controller 2 can shorten a time necessary for the screening by making a transition to the process in Step S306 after the skip.

The SSD controller 2 may repeat the processes in Steps S402 to S404 in FIG. 11 or the processes in Steps S403 to S404 in FIG. 12 at least once. Therefore, the influence of the read disturb on a read disturb failure detection target area can be strengthened to improve the detection rate of the screening.

Referring to FIG. 10, the SSD controller 2 adds the selected block to the processed list after Step S305 (Step S306).

Instead of the processed list in Step S300, the SSD controller 2 may initialize an unprocessed list stored in the RAM, and delete the selected block from the unprocessed list in Step S306. The SSD controller 2 determines whether all the blocks in the user area 3C of the NAND flash memory 3 are selected (Step S307). When all the blocks in the user area 3C of the NAND flash memory 3 are not selected (No in Step S307), the SSD controller 2 returns to Step S301 to select the next block.

When all the blocks in the user area 3C of the NAND flash memory 3 are selected (Yes in Step S307), the SSD controller 2 determines whether a predetermined time elapses (Step S308). Alternatively, in Step S308, the SSD controller 2 may determine whether the number of loops reaches a predetermined value. When the predetermined time does not elapse (or when the number of loops does not reach the predetermined value) (No in Step S308), the SSD controller 2 repeatedly performs the processes in Steps S300 to S307. Desirably the SSD controller 2 increments the PageAddressRDIST every loop of Steps S300 to S307. On the other hand, when the predetermined time elapses (or when the number of loops reaches the predetermined value) (Yes in Step S308), the SSD controller 2 ends the screening operation.

FIGS. 13 and 14 illustrate read orders of each page in the case that the number of physical pages per block is 256 pages. FIG. 13 illustrates an example in the case that the flowchart in FIG. 11 is used, and FIG. 14 illustrates an example in the case that the flowchart in FIG. 12 is used.

Figures 15, 16:
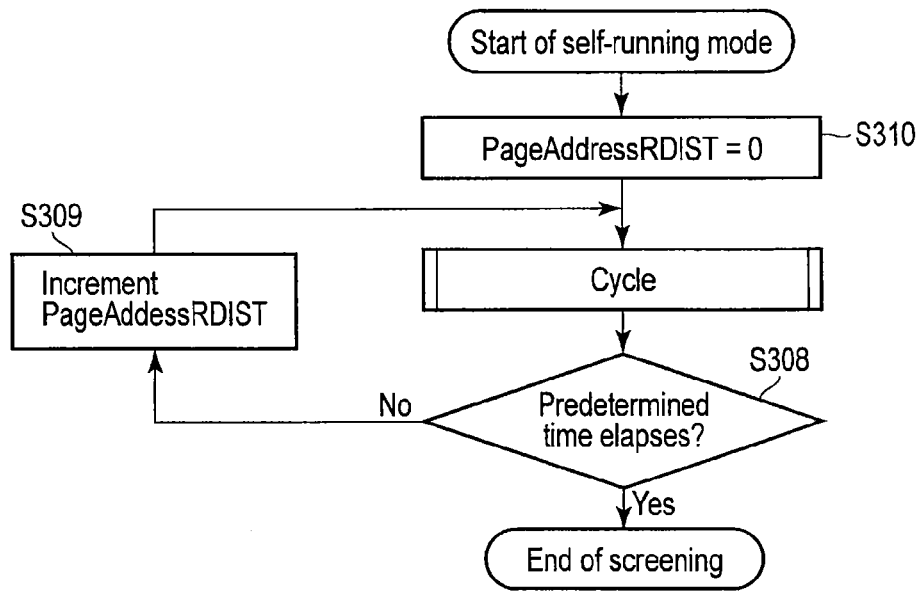
FIG. 15 is a view illustrating a relationship of a page address and a cycle.
FIG. 16 is a view illustrating a relationship between the page address and a cycle number.

In the example in FIG. 13, the SSD controller 2 reads the pages having the page addresses 0 to 255 in the ascending order while skipping the read of the page having the PageAddressRDIST. The SSD controller 2 reads the page having the PageAddressRDIST as the read of the 255th page after reading all other pages. As illustrated in FIG. 15, the SSD controller 2 increments the PageAddressRDIST every loop (cycle). For example, as illustrated in FIG. 16, the PageAddressRDIST makes such transitions as cycle number=0: PageAddressRDIST=0
cycle number=1: PageAddressRDIST=1
cycle number=2: PageAddressRDIST=2
cycle number=3: PageAddressRDIST=3
. . .

[4. Screening Log]

In the case various errors happen, the SSD controller 2 stores an error log (a screening log) in the screening log area 3E of the NAND flash memory 2. FIG. 17 illustrates an example of the screening log. The screening log includes items such as an event number, a time stamp, a cycle number, an error type, a temperature, and a physical address in which the error happens.

Event number: a serial number that is allocated to each log event of the screening log in time series Time stamp: a time (for example, second) that elapses until the error happens since the screening is started Cycle number: a serial number that is allocated to the cycle in FIG. 15 in time series Error type: identification information on the error. For example, the "write error" is written in the case that the program (write) process in Step S304 encounters an error. The "erase error" is written in the case that the erase process in Step S303 encounters an error. The "pre-read failure" is written in the case that the pre-read process in Step S302 encounters an error. The "uncorrectable ECC error" is written in the case that the read process in Steps S400 to S404 encounters an error. The "disturb failure" is written in the case that the read process in Steps S406 to S408 encounters an error.

Temperature: a temperature that is measured by the SSD controller 2 when the error happens Physical address in which error happens: an accessed physical address in an area of the NAND flash memory 3 when the error happens For example, when the read disturb failure is detected (Yes in Step S406), the SSD controller 2 records the read disturb failure event in the screening log area 3E (Step S409).

As illustrated in FIG. 18, the SSD controller 2 may record not only the failure event list but also an accumulated count of the read disturb failure in the screening log area 3E. For example, the SSD controller 2 records the accumulated count of the read disturb failure in the screening log area 3E every NAND memory chip address. Therefore, in a test process after the screening (post-screening test), the test device 100 easily specifies the NAND memory chip that should be replaced due to a high failure rate of disturb failures. Alternatively, the SSD controller 2 does not record the failure event list in the screening log area 3E, but may record the accumulated count of the read disturb failure in FIG. 18 in the screening log area 3E.

Figure 19:
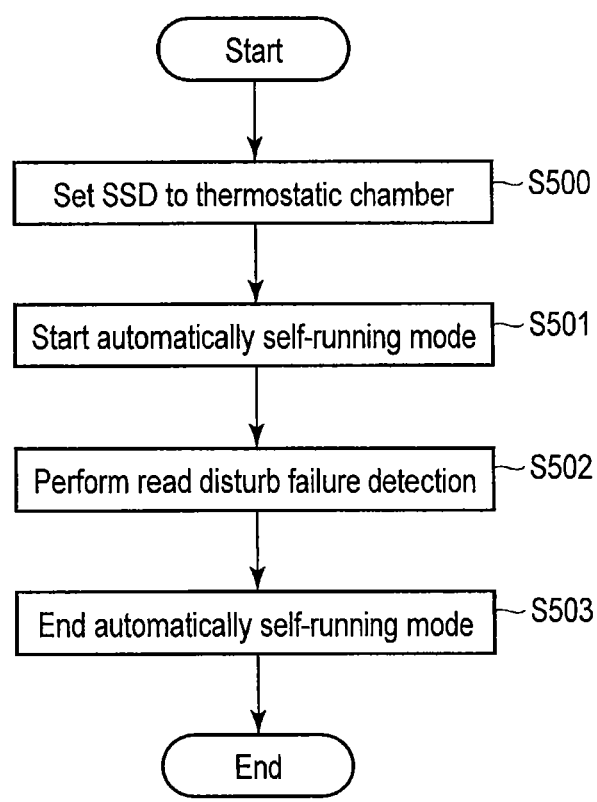
FIG. 19 is a flowchart illustrating an entire process of screening.
Figure 20:
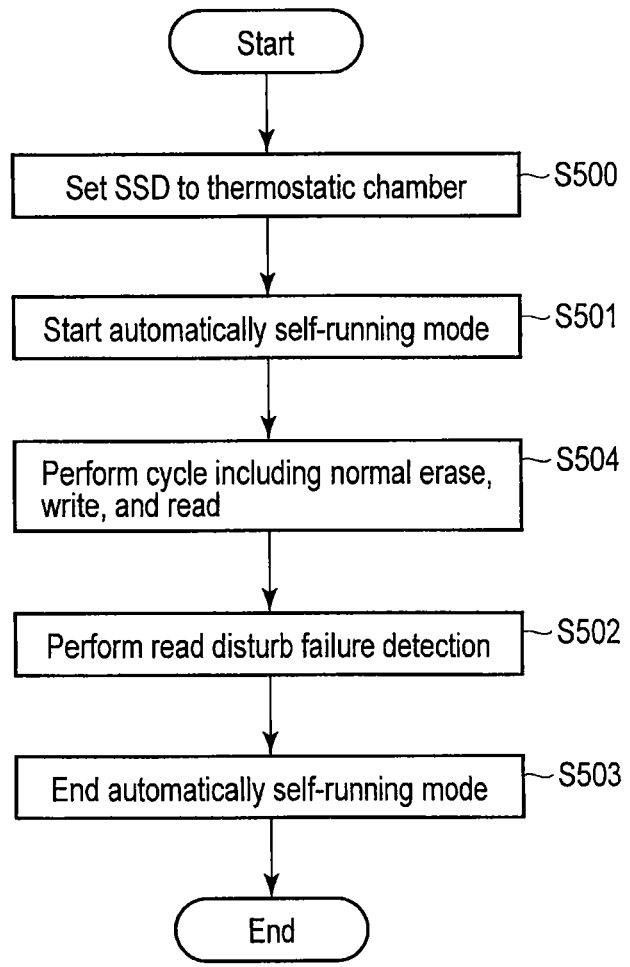
FIG. 20 is a flowchart illustrating an entire screening process.
Figure 21:
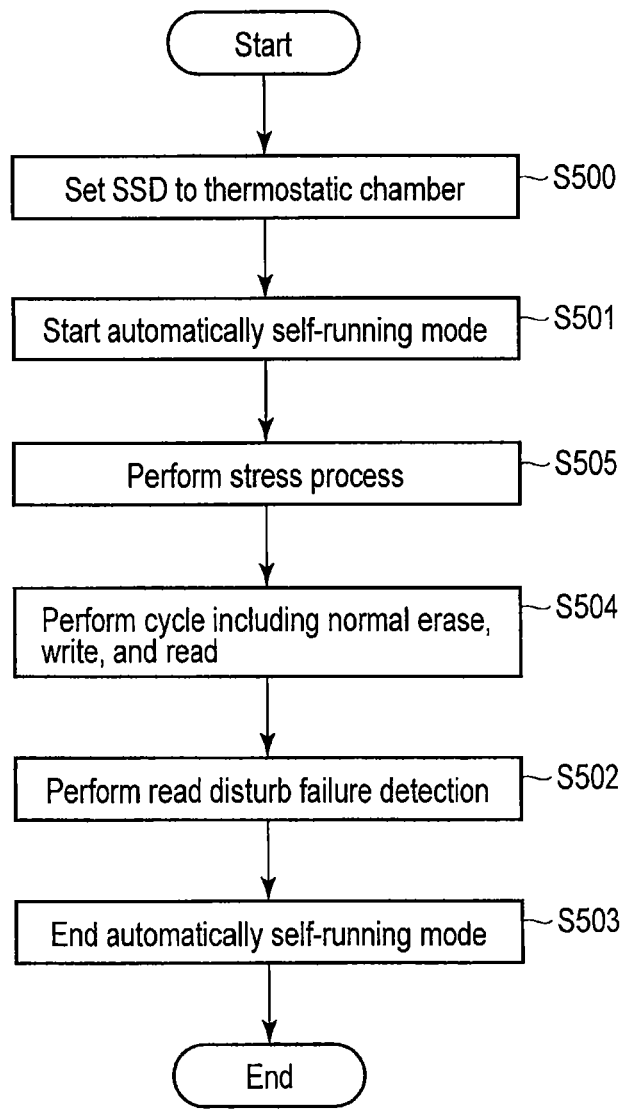
FIG. 21 is a flowchart illustrating an entire screening process.

FIG. 19 illustrates a flow of the entire screening. An operator who is in charge of manufacturing the SSD 1 sets the SSD 1 to the thermostatic chamber 41 (Step S500). The SSD controller 2 automatically starts the self-running mode to perform the screening (Step S501). In the self-running mode, the SSD controller 2 controls the LED 42 to notifies the operator of the state or result of the screening. The SSD controller 2 performs the screening including the read disturb failure detection process in FIG. 10 (Step S502). The SSD controller 2 automatically ends the self-running mode (Step S503). The SSD controller 2 controls the LED 42 to notify the operator that the screening is ended. In the case that the screening is abnormally ended due to an error, the SSD controller 2 controls the LED 42 to notify the operator that the screening is abnormally ended. As illustrated in FIG. 20, the SSD controller 2 may combine the screening with another function before the read disturb failure detection (Step S502) such that the cycle (Step S504) including the normal erase, write, and read is performed. As illustrated in FIG. 21, a stress process described in U.S. Patent Application No. 2013/602,763 may be performed before the read disturb failure detection (Step S505).

[5. Post-Screening Test]

Figure 22:
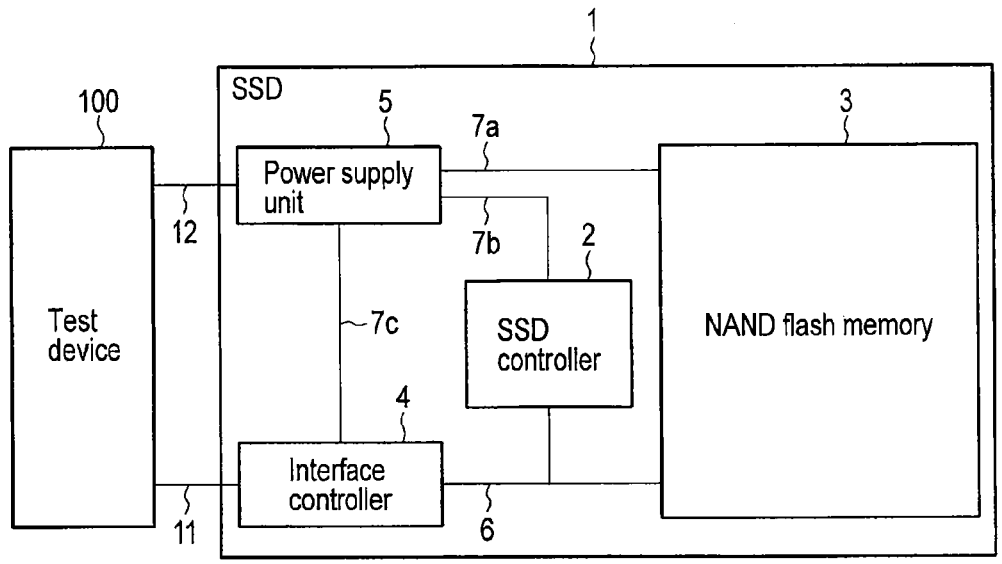
FIG. 22 is a schematic diagram of a test device.

The operator sees the LED 42 to check the end of the screening. Alternatively, the operator may consider the screening to be ended when a predetermined time elapses since the screening is started. When checking the end of the screening, the operator detaches the SSD 1 from the power-supply device 40, connects the SSD 1 to the test device 100 as illustrated in FIG. 22, and controls the test device 100 to start a post-screening test. The test device 100 is configured to be able to be connected to the SSD 1.

Figure 23:
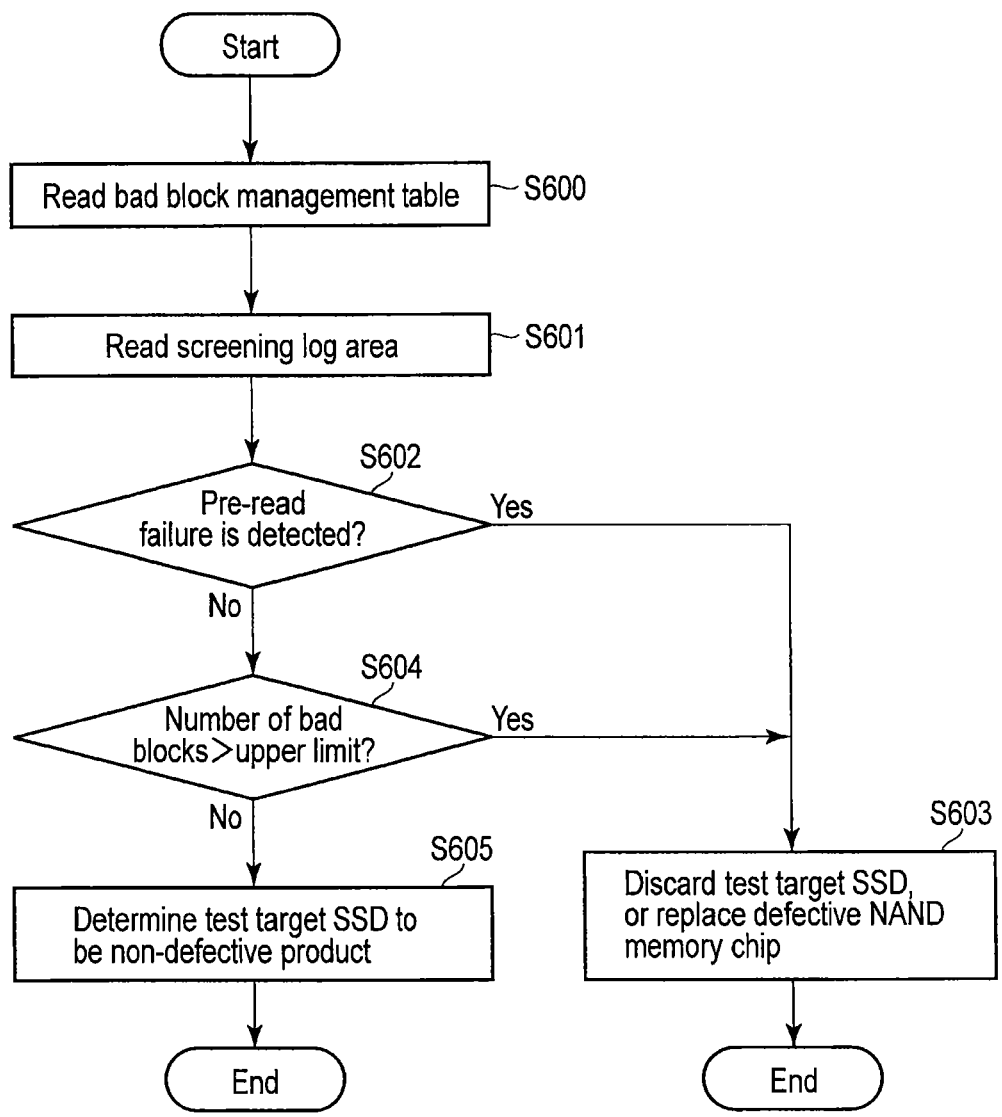
FIG. 23 is a flowchart of a post-screening test.

FIG. 23 is a flowchart of the post-screening test. The test device 100 reads the screening log area 3E and the bad block management table 3D (Steps S600 and S601). The read operations in Steps S600 and S601 may be performed using the SCT command described in U.S. Patent Application No. 2013/602,763 or the vendor unique command. The test device 100 determines whether the pre-read failure happens during the screening using the log read from the screening log area 3E (Step S602). When the pre-read failure happens (Yes in Step S602), the test device 100 issues an instruction to the operator to discard the test target SSD (Step S603). Alternatively, the test device 100 may specify the NAND memory chip in which the pre-read failure happens from the physical address of the screening log area 3E, and issue an instruction to the operator to replace the failure NAND memory chip (Step S603).

When the pre-read failure is not detected (No in Step S602), the test device 100 calculates the number of bad blocks from the bad block management table 3D, and determines whether the number of bad blocks is greater than an upper limit (Step S604). The upper limit is pre-defined from a reliability evaluation at a development stage such that a product life of the SSD 1 falls within a product specification. For example, the upper limit is stored in a storage area of the test device 100 or the NAND flash memory 3 of the SSD 1. The test device 100 may calculate a total number of bad blocks of the whole NAND flash memory 3 to compare the total value to the upper limit, the test device 100 may calculate the number of bad blocks of each memory cell array 22 to compare the number of bad blocks to the upper limit, or the test device 100 may calculate the number of bad blocks of each plane to compare the number of bad blocks to the upper limit. When the number of bad blocks is greater than the upper limit (Yes in Step S604), the test target SSD is discarded (Step S603). Alternatively, the NAND memory chip in which many bad blocks are generated is specified from the physical address of the bad block management table 3D, and the NAND memory chip may be replaced (Step S603).

When the number of bad blocks is less than or equal to the upper limit (No in Step S604), the test device 100 determines that the test target SSD is a non-defective product, and notifies the operator that the test target SSD is the non-defective product (Step S605). In reading the number of bad blocks from the bad block management table 3D, an interface such as a UART (Universal Asynchronous Receiver Transmitter) may be used in addition to the interface 11.

In the post-screening test, desirably the test device 100 calculates the accumulated count of the read disturb failure from the screening log, and determines that the SSD having the extremely large accumulated count of the read disturb failure is the defective product. For example, in the error event list of the screening log area 3E in FIG. 17, the test device 100 can calculate the accumulated count of the read disturb failure by counting the number of rows in each of which the error type is the disturb failure. The test device 100 may calculate the accumulated count of the read disturb failure from the SSD controller 2 through the interface 11 such that the SSD controller 2 stores the accumulated count of the read disturb failure in the screening log area 3E or such that the SSD controller 2 calculates the accumulated count of the read disturb failure from the screening log.

The SSD controller 2 may record the accumulated count of the read disturb failure in the screening log area 3E. The accumulated count of the read disturb failure has the initial value of 0. When the read disturb failure happens (Yes in Step S407), the SSD controller 2 increments the accumulated count of the read disturb failure, and stores the incremented accumulated count of the read disturb failure in the screening log area 3E. When the test device 100 transmits a request to acquire the accumulated count of the read disturb failure to the SSD controller 2, the SSD controller 2 acquires the accumulated count of the read disturb failure from the screening log area 3E, and transmits the accumulated count of the read disturb failure to the test device 100.

Figure 24:
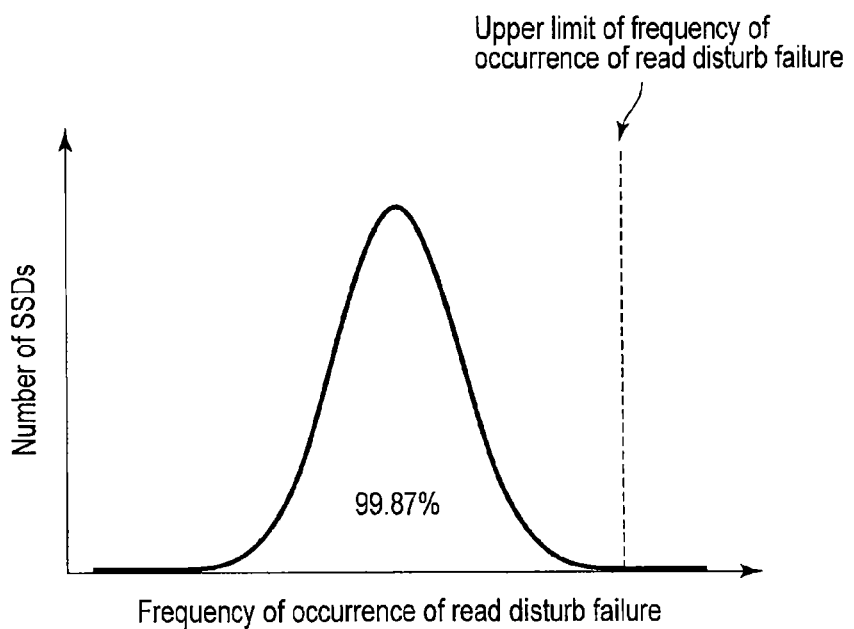
FIG. 24 is a view illustrating a distribution of a accumulated count of a read disturb failure.

During the development or production of the SSD 1, a developer of the SSD 1 can count the accumulated count of the read disturb failure using many SSDs 1, and obtain a distribution of the accumulated count of the read disturb failure (FIG. 24). For example, the developer defines the accumulated count of the read disturb failure of lower $3\sigma$ (that is, the accumulated count of the read disturb failure at a position in which a lower cumulative probability of a probability distribution becomes 99.87%) in the distribution as the upper limit of the accumulated count of the read disturb failure. In the post-screening test, desirably the test device 100 determines that the SSD in which the accumulated count of the read disturb failure is larger than the upper limit of the accumulated count of the read disturb failure is the defective product.

As described above, the failure of the peripheral circuit of the memory cell array 22 and the wiring failure can be cited as an example of the pre-read failure. Desirably the test device 100 notifies the operator such that the SSD 1 in which the pre-read failure happens is not shipped, unless the NAND memory chip in which the pre-read failure happens is already replaced. In the case that the pre-read failure happens, the SSD controller 2 immediately ends the screening or the self-running mode, and controls the LED to notify the operator that the screening is abnormally ended to determine the SSD 1 to be the defective product. The operator detaches the SSD 1 in which the pre-read failure happens from the thermostatic chamber 41, and connects another screening process target SSD 1 to the thermostatic chamber 41. Therefore, the thermostatic chamber 41 can efficiently be operated, the number of processable SSDs is increased by the thermostatic chamber 41, and the power consumed per SSD by the thermostatic chamber 41 can be saved.

[6. Advantageous Effect]

As described above, in the process of reading the selected blocks in the screening, the SSD controller 2 performs the read operation to the read disturb failure detection target page after the read operation is performed to the pages except the read disturb failure detection target page. In the case that the read error happens during the read operation to the read disturb failure detection target page, the SSD controller 2 records the read error event as the read disturb failure in the screening log area 3E. Therefore, the read disturb failure can be detected by the test device 100 while distinguished from other failures.

When the read disturb failure happens, the SSD controller 2 marks the failure block as the bad block, and manages the bad block such that the data is not written to and read from the bad block. Therefore, even if the block having the high read disturb failure rate exists, the SSD controller 2 performs the screening by marking the block having the high read disturb failure rate as the bad block before the shipment, and the field failure rate caused by the read disturb failure can be reduced.

Figure 25:
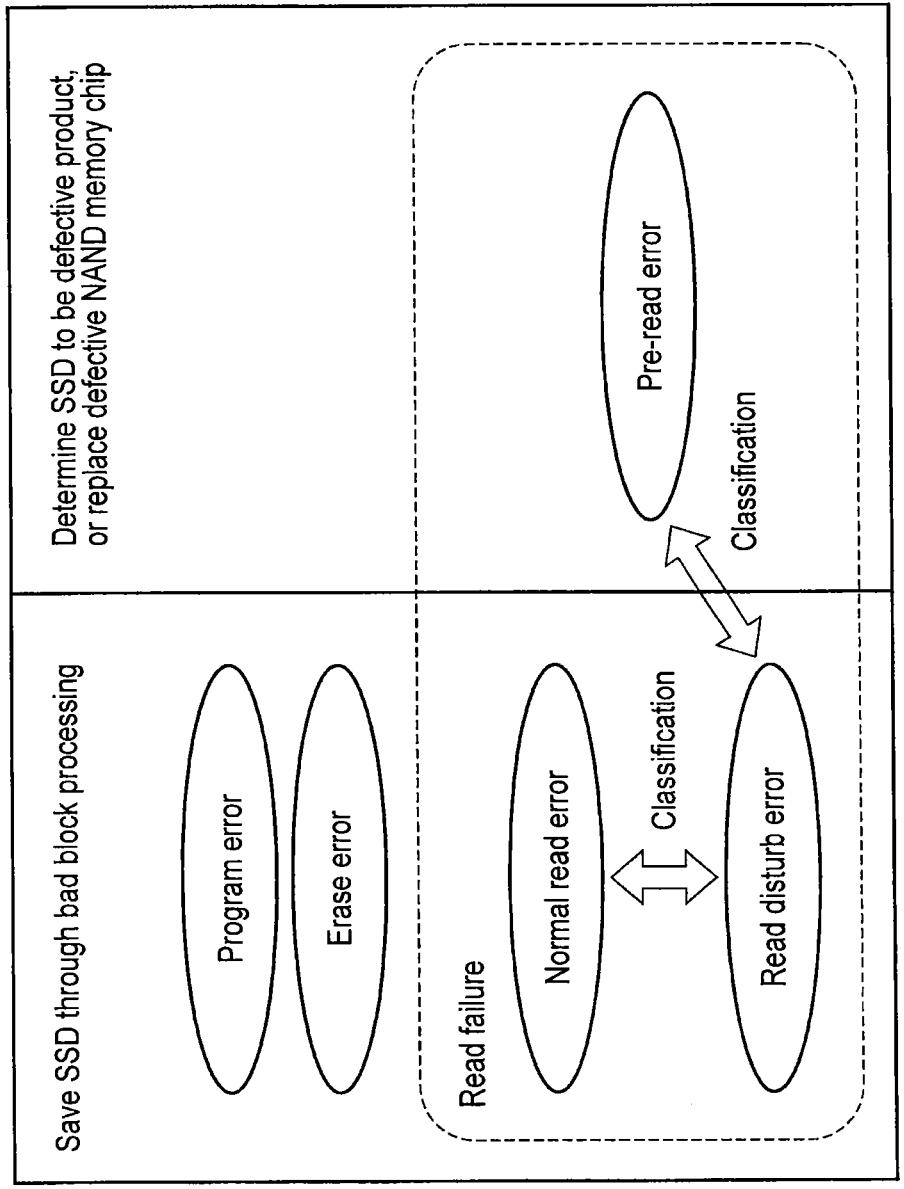
FIG. 25 is a view illustrating a processing content of pre-shipment process.

The SSD controller 2 performs the read operation in Step S406 to read the read disturb failure detection target page before changing the selected block in Step S301, the SSD controller 2 selects and tests the block in Steps S301 to S306, and the SSD controller 2 performs the pre-read operation in Step S302 after selecting the block again in Step S301. In the case that the read error happens in the pre-read operation, the SSD controller 2 records the read error event as the pre-read failure in the screening log area 3E. Therefore, the rate of the false detection in which the pre-read failure is taken for the read disturb failure or the rate of the false detection in which the read disturb failure is taken for the pre-read failure can be suppressed. The suppression of the rate of the false detection of the pre-read failure as the read disturb failure can prevent degradation of a product yield due to false determination of the test target SSD, which is caused by the false determination that the read disturb failure is the pre-read failure. FIG. 25 illustrates a classification of the error and failure and a classification of processing contents pre-shipment process.

Second Embodiment

Figure 26:
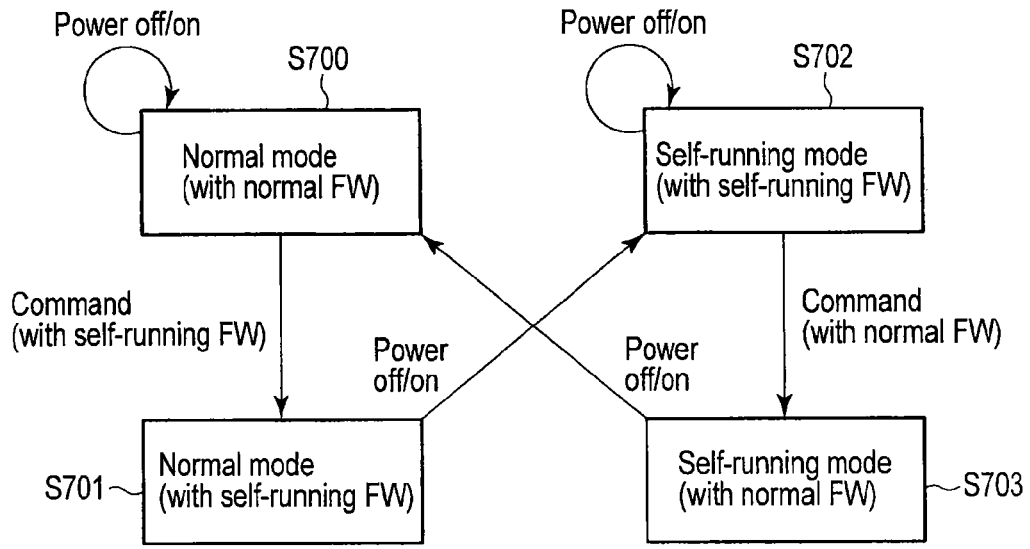
FIG. 26 is a state transition diagram illustrating a switching operation between a normal mode and a self-running mode according to a second embodiment.

A second embodiment is an example of a method for switching between the normal mode and the self-running mode. FIG. 26 is a state transition diagram illustrating a switching operation between the normal mode and the self-running mode of the second embodiment. Desirably an SSD controller 2 transmits signals having different patterns corresponding to states of the SSD controller 2 to, for example, a DAS/DSS signal line to notify the operator of each state.

In the second embodiment, the SSD controller 2 uses two types of firmware, namely, normal firmware (normal FW) and self-running firmware (self-running FW) as a method for switching the normal mode and the self-running mode.

The firmware can be rewritten using the command that is defined in the interface supported by an SSD 1. For example, the Download Microcode command compliant with ASC-2 is used as described in detail in the first embodiment.

For example, the normal mode firmware and the self-running mode firmware are stored in a server connected to a network, and downloaded in a firmware area 3A in the following procedure. A test device 100 is connected to the server through the network. The test device 100 downloads the firmware onto the storage area of the test device 100 through the Internet. The test device 100 transmits the firmware to the SSD 1 through an interface 11, and the SSD controller 2 writes the received firmware to the firmware area 3A.

Alternatively, for example, the normal mode firmware and the self-running mode firmware may be stored in an optical medium such as a DVD-ROM or a nonvolatile storage medium such as a USB memory. The test device 100 accesses the storage medium to copy the firmware in the storage area of the test device 100. The test device 100 transmits the firmware to the SSD 1 through the interface 11, and the SSD controller 2 writes the received firmware to the firmware area 3A.

A state S700 indicates that the SSD controller 2 is in the normal mode and that the normal firmware is written to the firmware area 3A of a NAND flash memory 3. In the state s700, when the SSD 1 is powered on, the SSD controller 2 performs the normal firmware written to the normal firmware area 3A to become the normal mode.

For example, during the test, when the test device 100 writes the self-running firmware to the SSD 1 using the ATA Download Microcode command, the SSD controller 2 makes the transition from the state S700 to a state S701. That is, the state S701 indicates that the SSD controller 2 is in the normal mode and that the self-running firmware is written to the firmware area 3A. When the SSD 1 is powered on in the state S701, the SSD controller 2 makes the transition from the state S701 to a state S702, and the SSD controller 2 performs the self-running firmware written to the firmware area 3A to become the self-running mode. In the state S702, the SSD controller 2 performs the screening operation. When the SSD 1 is powered on in the state S702, the SSD controller 2 performs the self-running firmware written to the firmware area 3A to become the self-running mode.

After the screening, when the test device 100 writes the normal firmware to the SSD 1 using the Download Microcode command, the SSD controller 2 makes the transition from the state S702 to a state S703. That is, the state S703 indicates that the SSD controller 2 is in the self-running mode and that the normal firmware is written to the firmware area 3A. When the SSD 1 is powered on in the state S703, the SSD controller 2 makes the transition from the state S703 to a state S700, and the SSD controller 2 performs the normal firmware written to the firmware area 3A to become the normal mode.

The test device 100 is used in pre-conditioning before the screening or the test process after the screening. Before the screening, the operator connects the SSD 1 to the test device 100, and controls the test device 100 to rewrite the firmware area 3A (the state S700→the state S701). Then the operator connects the SSD 1 to the power-supply device 40, and the SSD controller 2 makes the transition to the state S702 to start the screening. After the screening, the operator connects the SSD 1 to the test device 100, and controls the test device 100 to rewrite the firmware area 3A (the state S702→the state S703). Then the operator controls the test device 100 to cut off the power supplied from the power supply line 12, and supplies the power again to cause the SSD controller 2 to finally make the transition to the state S700.

After the firmware area 3A is rewritten using the download microcode command, the SSD controller 2 does not make the transition from the state S701 to the state S702 or from the state S703 to the S700 unless the SSD 1 is powered on and off. Alternatively, once the download microcode command is received, the SSD controller 2 may make the transition of the state S700→the state S701→the state S702 or the state S702→the state S703→the state S700 immediately.

Advantageous Effect

As described in detail above, in the second embodiment, the normal mode and self-running mode of the SSD 1 can be switched using the external command. Therefore, the normal mode and the self-running mode can easily and correctly be switched.

Third Embodiment

Figure 27:
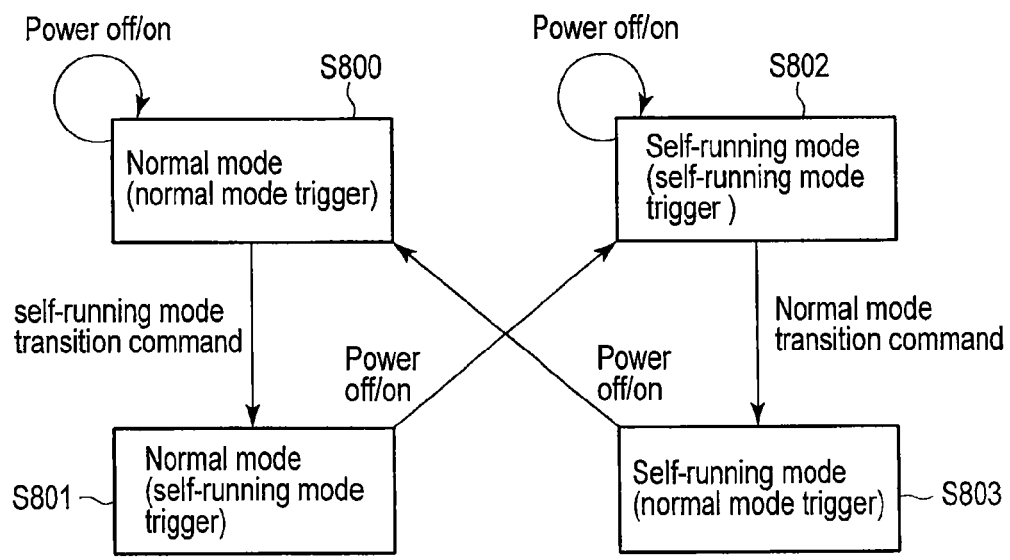
FIG. 27 is a state transition diagram illustrating a switching operation between a normal mode and a self-running mode according to a third embodiment.

In a third embodiment, using only a normal firmware that can perform both the normal mode and the self-running mode, the mode performed in the normal firmware is selected with the command as a trigger. FIG. 27 is a state transition diagram illustrating the switching operation between the normal mode and the self-running mode of the third embodiment.

In the third embodiment, an SSD controller 2 uses a normal firmware that can perform both the normal mode and the self-running mode as the method for switching between the normal mode and the self-running mode. A test device 100 transmits the command to the SSD 1 to rewrite the trigger that determines which normal mode or self-running mode in the normal firmware is performed. For example, the SCT command described in ACS-3 or the vendor unique command is used as the command to rewrite the trigger.

A state S800 is a default state in which the normal firmware is written to a firmware area 3A of a NAND flash memory 3. The state S800 indicates that the SSD controller 2 is in the normal mode and that the normal mode is triggered. When the SSD 1 is powered on in the state S800, the state S800 becomes the triggered normal mode.

When the test device 100 transmits a command (a self-running mode transition command) that triggers the self-running mode to the SSD 1, the SSD controller 2 makes the transition from the state S800 to a state S801. That is, the state S801 indicates that the SSD controller 2 is in the normal mode and that the self-running mode is triggered. When the SSD 1 is powered off and on in the state S801, the SSD controller 2 makes the transition from the state S801 to a state S802. The SSD controller 2 performs the self-running mode triggered in the normal firmware to make the transition to the self-running mode. In the state S802, the SSD controller 2 performs the screening operation. When the SSD 1 is powered off and on in the state S802, the SSD 1 remains in the self-running mode because the self-running mode is triggered in the normal firmware.

When the test device 100 transmits a command (a normal mode transition command) that triggers the normal mode to the SSD 1 after the screening, the SSD controller 2 makes the transition from the state S802 to a state S803. That is, the state S803 indicates that the SSD controller 2 is in the self-running mode and that the normal mode is triggered. When the SSD 1 is powered off and on in the state S803, the SSD controller 2 makes the transition from the state S803 to the state S800, and performs the normal mode triggered in the normal firmware to make the transition to the normal mode.

Before the screening, the operator connects the SSD 1 to the test device 100. The operator controls the test device 100, and the test device 100 transmits a transition command from the state S800 to the state S801 to the SSD 1. Then the operator connects the SSD 1 to the power-supply device 40, and the SSD controller 2 makes the transition to the state S802 to start the screening. After the screening, the operator connects the SSD 1 to the test device 100. The operator controls the test device 100, and the test device 100 transmits a transition command from the state S802 to the state S803 to the SSD 1. Then the operator cuts off the power supplied to the SSD 1 from the power supply line 12, and supplies the power again to cause the SSD controller 2 to finally make the transition to the state S800.

After the state transition command is issued, the SSD controller 2 does not make the transition from the state S801 to the state S802 or from the state S803 to the S800 unless the SSD 1 is powered on and off. Alternatively, once the state transition command is received, the SSD controller 2 may make the transition of the state S800→the state S801→the state S802 or the state S802→the state S803→the state S800 immediately.

Advantageous Effect

As described in detail above, in the third embodiment, the test device 100 or the host device 10 can transmit the command to the SSD 1 to switch between the normal mode and self-running mode of the SSD controller 2. Therefore, the normal mode and the self-running mode can easily and correctly be switched.

The SSD controller 2 can switch between the normal mode and the self-running mode using only a normal firmware. Therefore, it is not necessary to rewrite the firmware in shipping the product after the screening.

Fourth Embodiment

Figure 28:
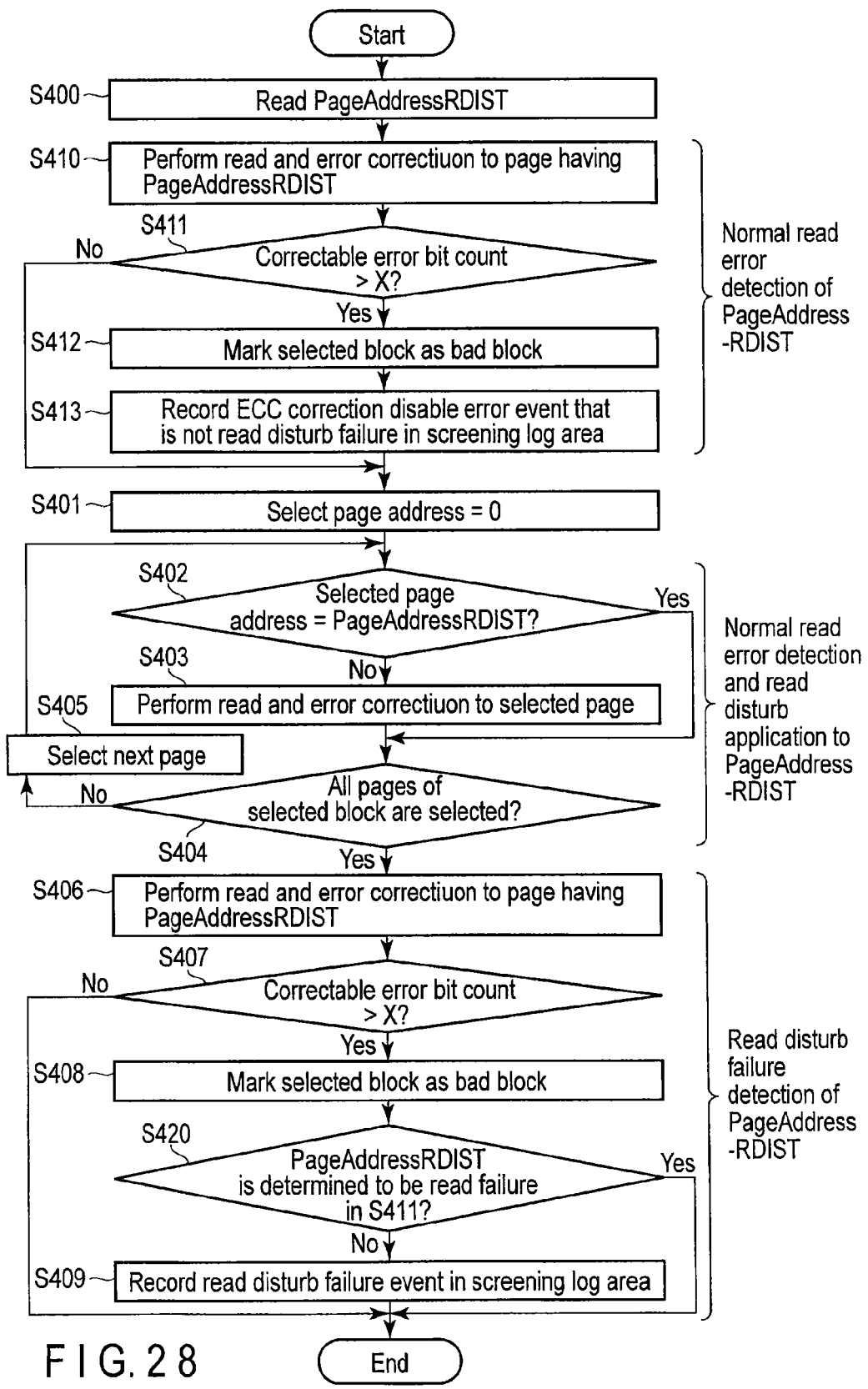
FIG. 28 is a flowchart illustrating a read operation according to a fourth embodiment.

FIG. 28 is a flowchart illustrating the read operation (Step S305) according to a fourth embodiment. In the read operation S305 of the fourth embodiment, an SSD controller 2 performs uncorrectable ECC error detection (read error detection) to the page having the PageAddressRDIST (Steps S410 to S413). Then the SSD controller 2 performs the uncorrectable ECC error detection to all the pages of the selected block except the page having the PageAddressRDIST (Steps S402 to S404). Then the SSD controller 2 performs read disturb failure detection to the page having the PageAddressRDIST (Steps S406 to S409, and S420).

The first-time read operation (Steps S410 to S413) is performed to the page having the PageAddressRDIST before the read operation of other pages, whereby the uncorrectable ECC error detection in Steps S410 to S413 is performed in a situation of the little influence of the read disturb. The process of the SSD controller 2 in the case that the read failure happens in the page having the PageAddressRDIST will be described below. (1) When the read failure happens in the first-time read operation in Step S410, the SSD controller 2 records an uncorrectable ECC error event that is not the read disturb failure in a screening log area 3E (Step S413). (2) When the read failure happens in the second-time read operation in Step S406, the SSD controller 2 records the error event as the read disturb failure in the screening log area 3E (S409).

In order to prevent the false detection in which the read error that is not the read disturb failure is taken for the read disturb failure, when the page having the PageAddressRDIST becomes the error in the read operation in Step S411 (Yes in S420), desirably the SSD controller 2 does not record the read disturb failure event in the screening log area 3E in Step S409. Therefore, the SSD controller 2 can clearly distinguish the read disturb failure of the PageAddressRDIST from the uncorrectable ECC error that is not the read disturb failure. That is, in the third embodiment, the probability of the false detection in which the uncorrectable ECC error that is not the read disturb failure is taken for the read disturb failure or the probability of the false detection in which the read disturb failure is taken for the uncorrectable ECC error that is not the read disturb failure can be decreased. The SSD controller 2 may determines that not only the uncorrectable ECC error event but also the event in which the correctable error bit count is greater than the predetermined value X are the read error.

The SSD controller 2 may select the plurality of pages in the selected block as the page having the PageAddressRDIST that is of the disturb failure detection target. In this case, the SSD controller 2 reads all the areas, which are read in the second-time read operation in Step S406, in the first-time read operation in Step S410. The area read in the second-time read operation in Step S406 is equal to or is included in the area read in the first-time read operation in Step S410. In FIG. 28, in the normal read error detection, the target area in the read operation in Step S403 is the area except the area read in the second-time read operation in Step S406. Alternatively, the read target area in the read operation in Step S403 may overlap with the read target area in the read operation in Step S406.

In the case that the error is detected in the normal read error detection of the PageAddressRDIST in Steps S410 to S413, the SSD controller 2 may not perform the read disturb failure detection to the PageAddressRDIST (Steps S406 to S409, and S420). In the case that the error is detected in the normal read error detection of the PageAddressRDIST in Steps S410 to S413, the SSD controller 2 may not perform the normal read error detection to the selected block (Steps S402 to S404).

In the read disturb failure detection in FIG. 28, when the uncorrectable ECC error event happens or the correctable error bit count is greater than the predetermined value in reading the page having the PageAddressRDIST in Step S406, the SSD controller 2 records the uncorrectable ECC error event/correctable ECC error event as the read disturb failure in the screening log area 3E (Step S409).

Figure 29:
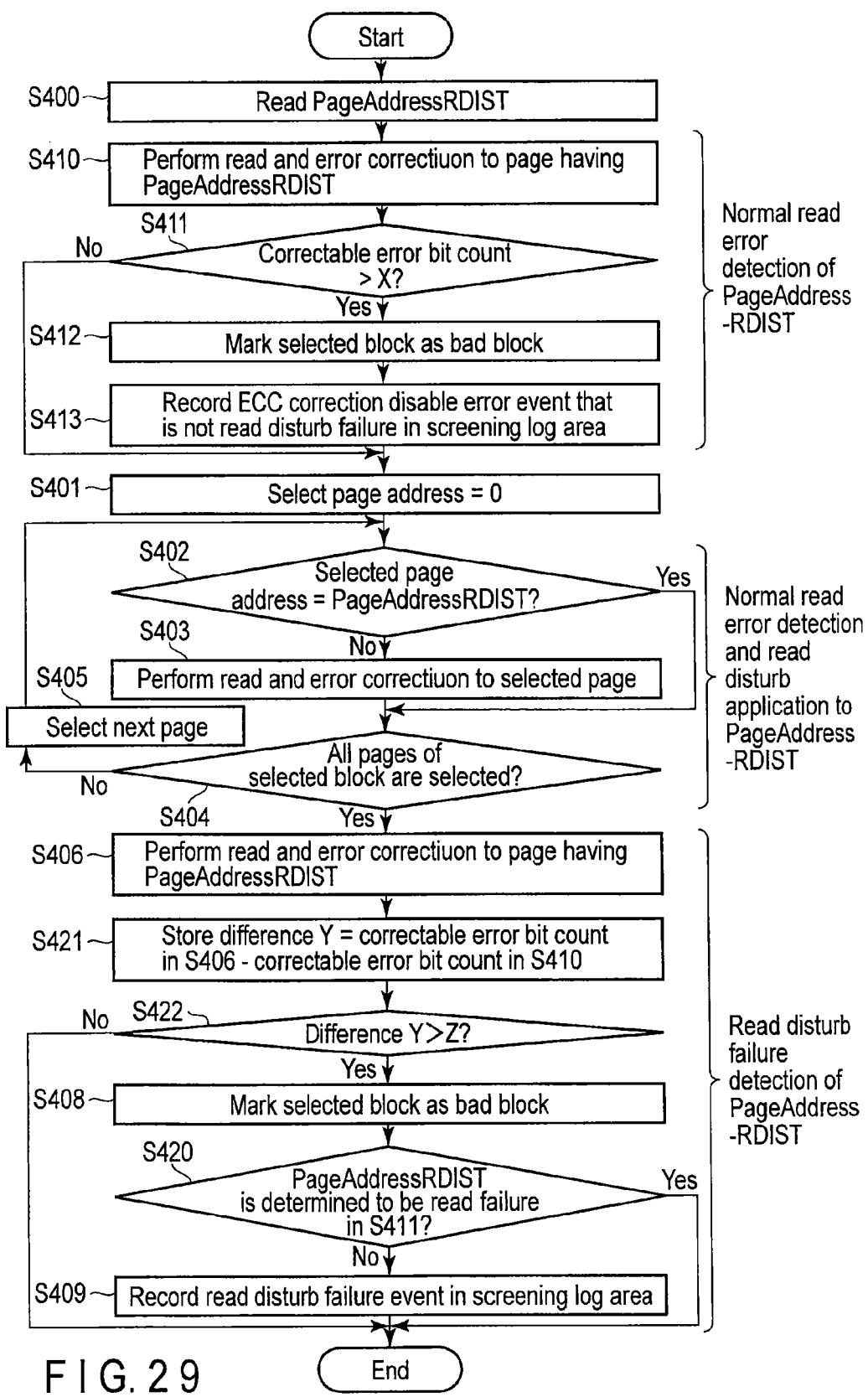
FIG. 29 is a flowchart illustrating a read operation of the fourth embodiment.

On the other hand, as illustrated in FIG. 29, when the correctable error bit count in the read disturb failure detection is greater than the correctable error bit count in the normal read error detection by a predetermined value, the SSD controller 2 may determine that the increase of the correctable error bit count in the read disturb failure detection is the read disturb failure event, and record the read disturb failure event in the screening log area 3E (Step S409). In this case, the SSD controller 2 stores a difference value in which the correctable error bit count in reading the page having the PageAddressRDIST in Step S410 is subtracted from the correctable error bit count in reading the page having the PageAddressRDIST in Step S406 in a variable Y (Step S421). When the difference Y is greater than a predetermined value Z (a subscribed value Z) (Yes in S422), the SSD controller 2 determines that the read disturb failure happens in the page having the PageAddressRDIST.

In order to enhance the detection rate of the read disturb failure, desirably the SSD controller 2 repeats the processes in Steps S402 to S404 in FIG. 28 (or the processes in Steps S402 to S404 in FIG. 29) at least once after all the pages of the selected block are selected so that the impact of the read disturb on the read disturb failure detection target area is accelerated.

In order to further enhance the detection rate of a read disturb failure in the step S407 and S422, the SSD controller may shift the Vread1 and the Vread2 applied to the cells of the PageAddressRDIST in the step S403 to a higher level than a normal read operation so that the impact of the read disturb to the PageAddressRDIST is accelerated during the step S403.

Advantageous Effect

In the process of reading the selected blocks in the screening, the SSD controller 2 performs the read operation to the read disturb failure detection target page before the read operation is performed to the pages except the read disturb failure detection target page. In the read operation, when the uncorrectable ECC error happens, or when such the read error that the correctable error bit count is greater than the predetermined value happens, the read error event that is not the read disturb failure and the read disturb failure detection target page address are recorded in the screening log area 3E. Then the SSD controller 2 performs the read operation to the read disturb failure detection target page after the read operation is performed to the pages except the read disturb failure detection target page. In the read operation, when the read error happens, the read disturb failure event and the read disturb failure detection target page address are recorded in the screening log area 3E. Therefore, the SSD controller 2 can previously detect the read errors, such as the data retention failure and the word line short circuit failure, which are not the read disturb failure in Step S410 that is the situation in which the disturb has no influence on the read disturb failure detection target page. The SSD controller 2 can reduce the rate of the false detection in which the read disturb failure is taken for the read error that is not the read disturb failure. The SSD controller 2 can reduce the rate of the false detection in which the read failure that is not the read disturb failure is taken for the read disturb failure. Thus, the read disturb failure and the read error that is not the read disturb failure can be detected while distinguished from each other.

Fifth Embodiment

In the method of the first and fourth embodiments, the SSD controller 2 selects the physical page of the read disturb failure detection target as the single or a plurality of pages having the PageAddressRDIST, and the pages having the PageAddressRDIST are read before the selected block is unselected to select another block, whereby the read disturb failure is handled while distinguished from other failures. In a fifth embodiment, the read operation is performed once or multiple times after all the pages of the selected block are read and before the block except the selected block is selected, whereby the read disturb failure is distinguished from other failures.

FIG. 30 is a flowchart illustrating the screening of the fifth embodiment. The screening of the fifth embodiment in FIG. 30 differs from the screening in FIG. 10 in that an SSD controller 2 reads the block at least twice after the program process in Step S304 and before the selected block is unselected to select another block in Step S301 (Steps S305B and S305C), that the read error is recorded as the read error event that is not the read disturb failure in a screening log area 3E when the read error happens in reading the block in the first time (Step S30513), and that the read error is recorded as the read disturb failure event in the screening log area 3E when the read error happens in reading the block in the second and subsequent times (Step S3050). In order to further strengthen the influence of the read disturb to enhance the detection rate of the read disturb failure, desirably the SSD controller 2 reads all the pages of the selected block in the read operation in Step S305B and the read operation in Step S305C. The SSD controller 2 may read all the pages of the selected block only once in the read operation in Step S305C. In order to increase a detection capacity of the read disturb failure, desirably the SSD controller 2 reads all the pages of the selected block at least twice in the read operation in Step S305C. The first-time reading operation in Step S305B may be identical to or different from the reading operation in Step S305C in the second and subsequent times in the order in which the physical page of the block is read.

In order to further enhance the detection rate of the read disturb failure in the step S305C, the SSD controller may shift the Vread1 and the Vread2 applied to the cells in the step S305C to a higher level than a normal read operation so that the impact of the read disturb is accelerated during the step S305C.

In the pre-read in Step S302 after the selected block is unselected to select another block in Step S301 and before the selected block is erased in Step S303, the SSD controller 2 may perform the read operation once or multiple times to distinguish the read disturb failure from other failures. In the fifth embodiment, the SSD controller 2 performs the read operation once or multiple times after all the pages of the selected block are read and before the selected block is unselected to select another block.

In FIG. 30, PageAddressSTART designates a starting page address when the selected block is read, and the SSD controller 2 stores the PageAddressSTART in the RAM 2A. In order to homogenize the influence of the read disturb through the screening, desirably the SSD controller 2 increments the PageAddressSTART every cycle (Step S309).

Figure 31:
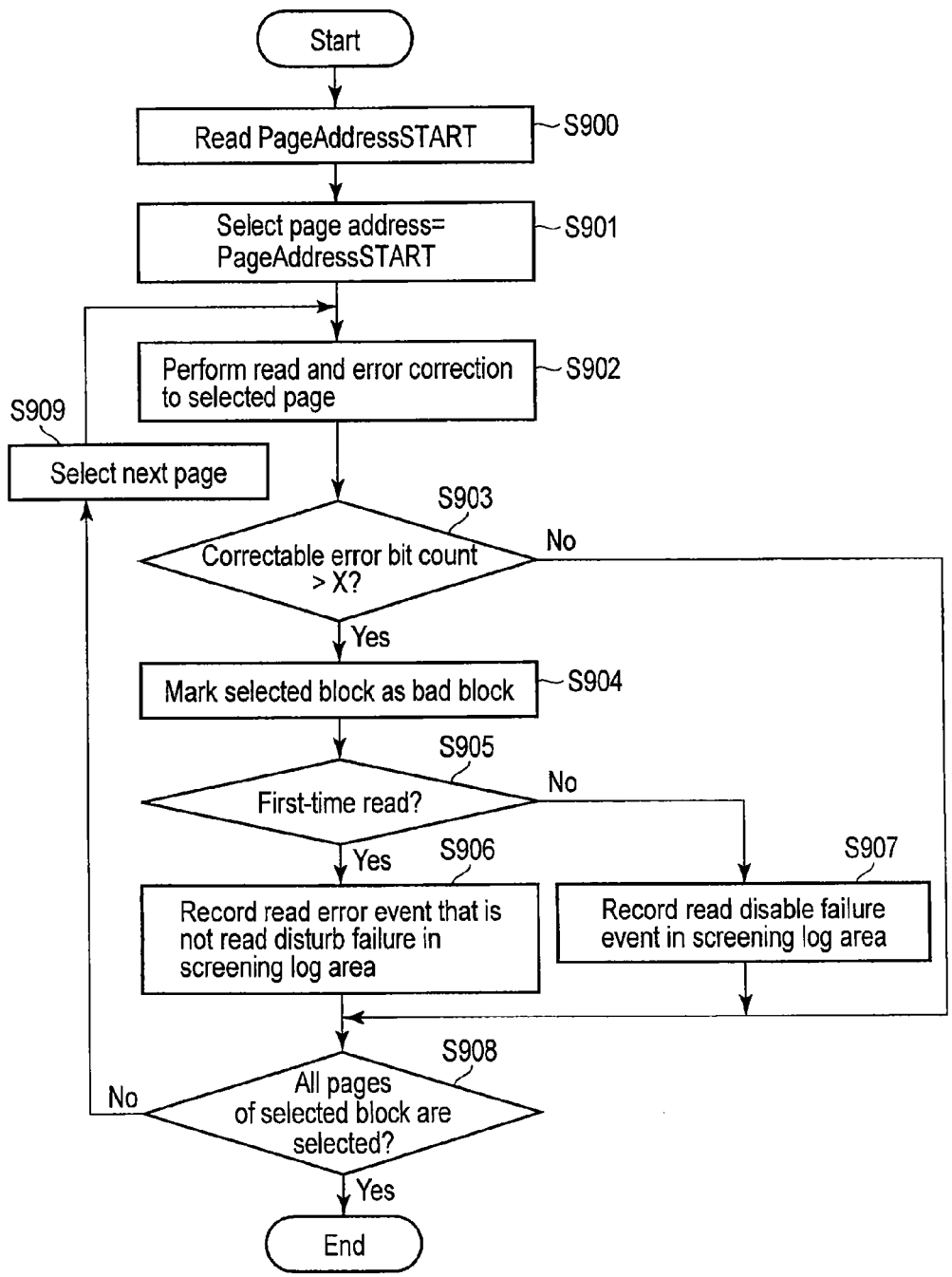
FIG. 31 is a flowchart illustrating a read operation.

In the case that the PageAddressSTART is incremented every cycle, in order to homogenize the influence of the read disturb through the screening, desirably the SSD controller 2 processes a common flow as a detailed processing flow of the first-time read operation in Step S305B and the read operation in Step S305C in the second and subsequent times. FIG. 31 is a flowchart illustrating the read operations in Steps S305B and S305C.

The SSD controller 2 reads the PageAddressSTART from the RAM 2A (Step S900), selects the physical page having the PageAddressSTART (Step S901), and reads the selected page to perform the error correction (Step S902). When the correctable error bit count is greater than the predetermined value X, or when the error correction cannot be performed (Yes in Step S903), desirably the SSD controller 2 marks the selected block as the bad block (Step S904). The SSD controller 2 determines whether the read operation is the first-time read operation in Step S305B (FIG. 30) or the second-time read operation in Step S305C (FIG. 30). When the read operation is the first-time read operation (Yes in S905), the SSD controller 2 records the ECC correction error event as the ECC correction error event that is not the read disturb failure in the screening log area 3E (Step S906). When the read operation is the read operation in the second and subsequent times (No in S905), the SSD controller 2 records the ECC correction error event as the read disturb failure event in the screening log area 3E (Step S907).

Figure 32:
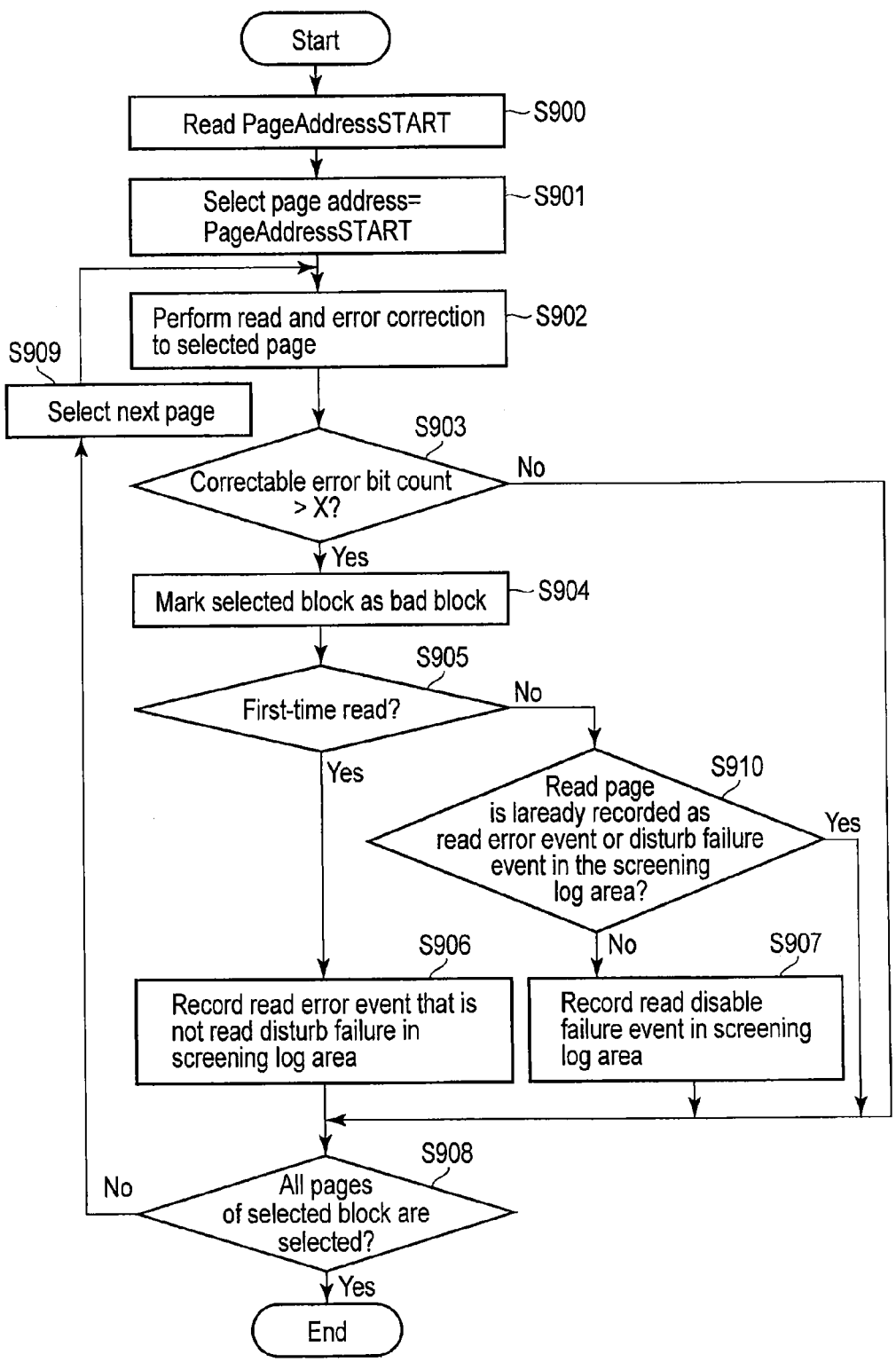
FIG. 32 is a flowchart illustrating a read operation.

As illustrated in FIG. 32, even in the read operation in the second and subsequent times (No in S905), when the selected page is already recorded as the read error event that is not the read disturb failure or the read disturb failure event in the screening log area 3E (Yes in S910), the SSD controller 2 may not record the read disturb failure event in the screening log area 3E. This is because possibly the read failure is not the read disturb failure. Even if the SSD controller 2 records the failure event, whether the page is the read error that is not the read disturb failure or the read disturb failure can be determined such that a test device 100 searches the physical address of the page from the screening log area 3E.

Figure 33:
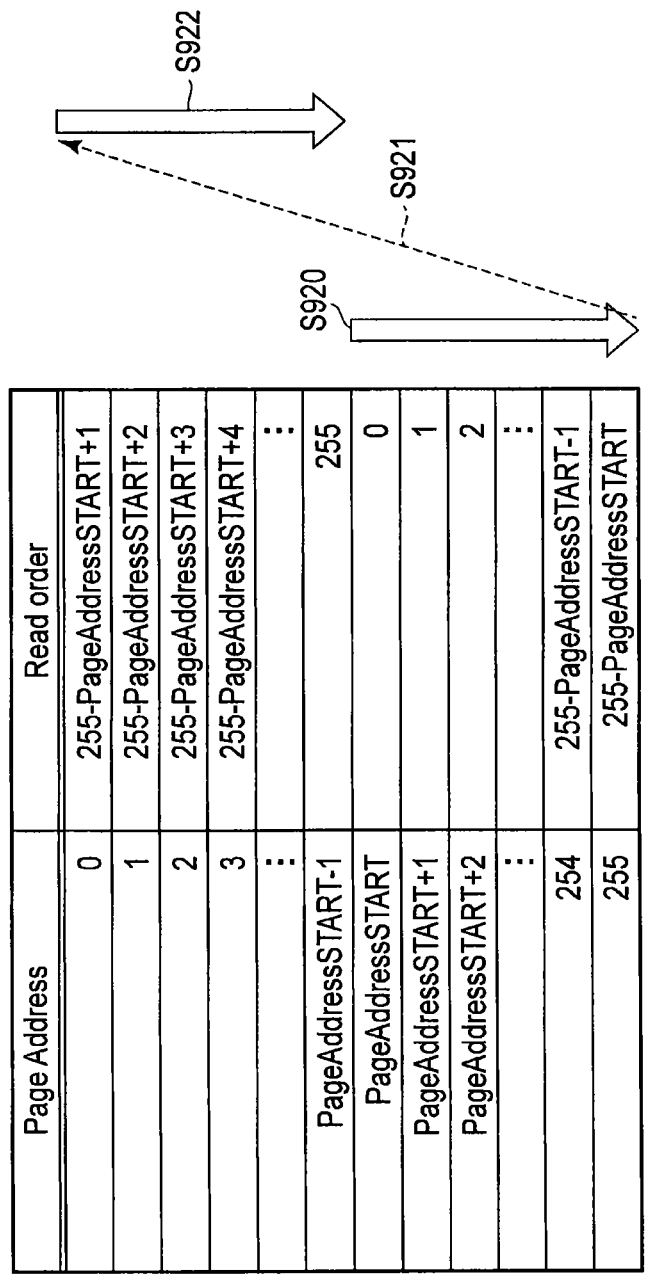
FIG. 33 is a view illustrating order of page read.

The SSD controller 2 determines whether all the pages of the selected block are selected (Step S908). When all the pages of the selected block are not selected (Step S908), the SSD controller 2 increments the selected page address (Step S909), and repeats the processes in Steps S902 to S908. As to the increment in Step S909, for example, as illustrated in FIG. 33, the selected page address is increased by 1 based on the PageAddressSTART (Step S920), the selected page address is set to 0 when the selected page address exceeds the tail end of the page address of the block (Step S921), and the selected page address is increased by one based on the address of 0 (Step S922).

In the case that the read error that is not the read disturb failure or the read disturb failure is detected in the read operations in Steps S305B and S305C, the SSD controller 2 may skip the subsequent processes in Steps S305B and S305C relating to the selected block, and make the transition to the process in Step S306. Therefore, the test time is shortened.

Advantageous Effect

In the fifth embodiment, the SSD controller 2 performs the read operation to the pages of the selected block at least twice after the program process (Step S304) for each selected block in the screening and before the selected block is unselected to select another block (Step S301). In the case that the read error happens in the first-time read operation (Step S305B), the SSD controller 2 records the read error event as the read error that is not the read disturb failure in the screening log area 3E. In the case that the read error happens in the read operations in the second and subsequent times (Step S305C), the SSD controller 2 records the read error event as the read disturb failure in the screening log area 3E. Therefore, the test device 100 can detect the read disturb failure while clearly distinguishing the read disturb failure from the read error and pre-read failure that are not the read disturb failure.

Sixth Embodiment

The NAND flash memory, in which the memory cell array in which the plurality of memory cells are stacked on the substrate, is well known as described above. In a sixth embodiment, a method for screening the SSD including the stacked NAND flash memory will be described.

[1. Configuration of Memory Cell Array]

A configuration of a memory cell array 22 will be described. The memory cell array 22 of the sixth embodiment can be used while replaced for the memory cell array 22 of the first embodiment in FIG. 3, and a peripheral circuit configuration of the memory cell array 22 of the sixth embodiment is identical to that of the first embodiment.

Figure 34:
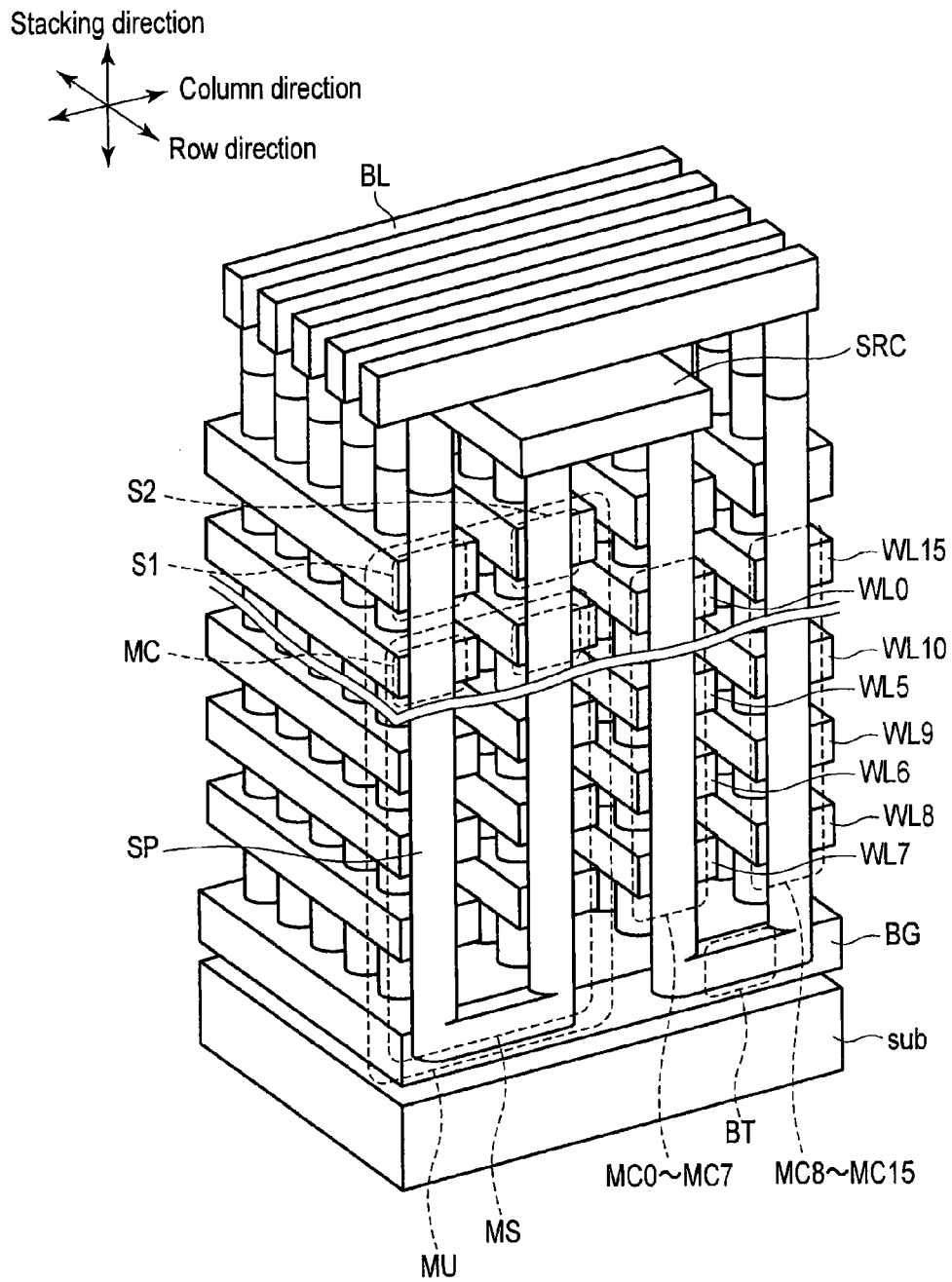
FIG. 34 is a perspective view illustrating part of the memory cell array.
Figure 35:
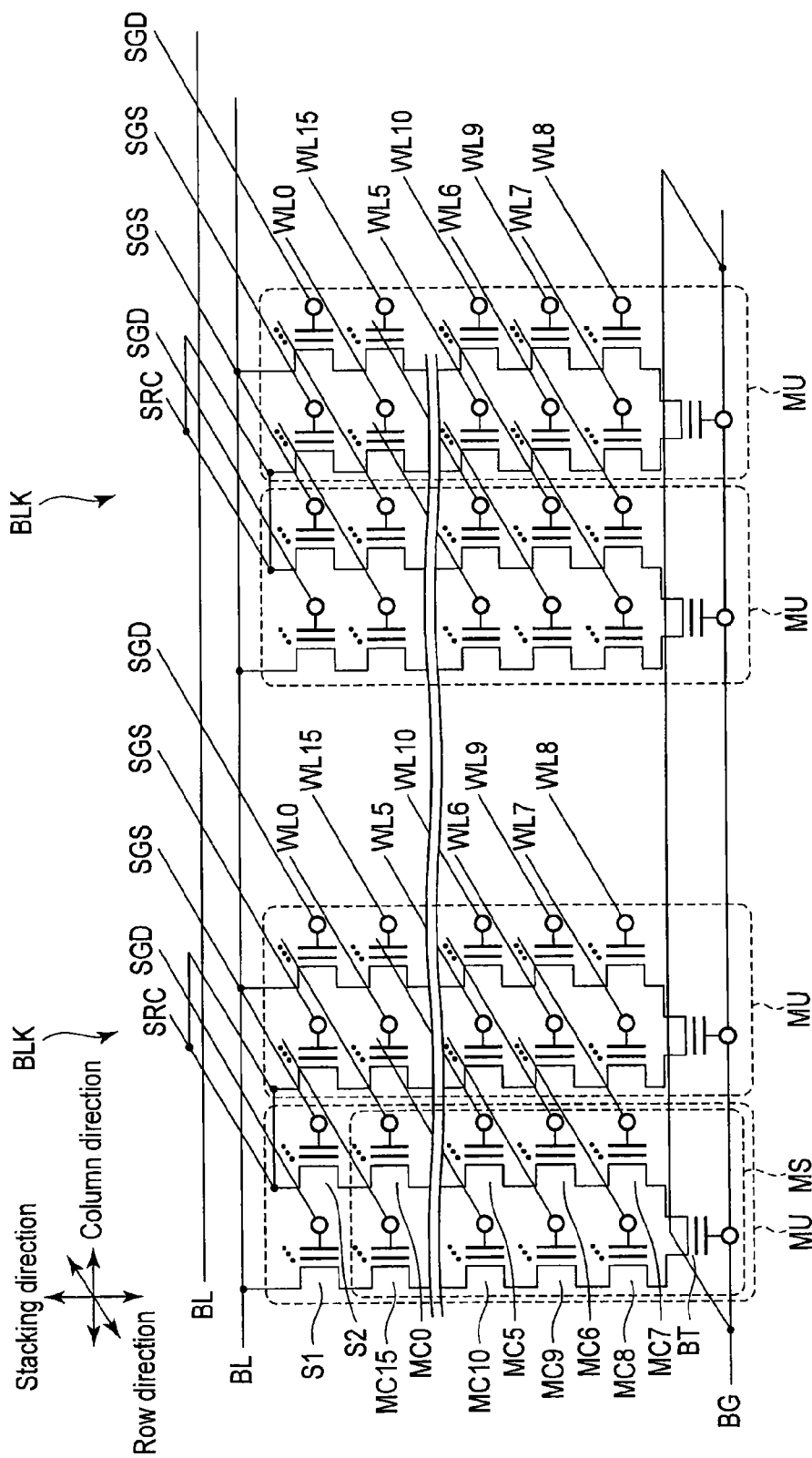
FIG. 35 is a circuit diagram illustrating part of the memory cell array.

For example, the memory cell array 22 of the sixth embodiment has a structure in FIGS. 34 and 35. FIG. 34 is a perspective view illustrating part of the memory cell array 22. FIG. 35 is a circuit diagram illustrating part of the memory cell array 22. The memory cell array 22 includes a plurality of bit lines BL, a plurality of source lines SRC, and a plurality of blocks BLK. The block BLK includes a plurality of memory units MU that are two-dimensionally arrayed along a row direction and a column direction. In the block BLK, the plurality of memory units MU are connected to a bit line BL.

The memory unit MU is constructed by a memory string MS and select gates S1 and S2. The memory string MS is located above a substrate sub along a stacking direction of the substrate sub. The memory string MS includes a plurality of (for example, 16) series-connected memory cells MC0 to MC15 and a back gate BT. The memory cells MC0 to MC7 are arrayed along the stacking direction in the direction in which the memory cells MC0 to MC7 come close to the substrate sub in this order. The memory cells MC8 to MC15 are arrayed along the stacking direction in the direction in which the memory cells MC0 to MC7 are separated away from the substrate sub in this order. The memory cell MC includes a semiconductor layer SP, an insulating film on a surface of the semiconductor layer SP, and a word line (control gate) WL. The back gate BT is connected between the memory cells MC7 and MC8 in the lowermost layer. The memory cells MC0 to MC15, the back gate BT, and the select gates S1 and S2 are formed in a U-shape semiconductor layer.

Each of the select gates S1 and S2 is located in the upper portion along the stacking direction of the memory cells MC0 and MC15. A drain of the select gate S2 is connected to an end of the memory string MS (a source of the memory cell MC0). The source of the select gate S1 is connected to the other end of the memory string MS (the drain of the memory cell MC15). The drain of the select gate S1 is connected to the bit line BL. The source of the select gate S2 is connected to the source line SRC.

The gates of the memory cells MC0 of the plurality of memory units MU arrayed along the row direction of each block BLK are commonly connected to the word line WL0. Similarly, the gates of the memory cells MC1 to MC15 of the plurality of memory units MU arrayed along the row direction of a block BLK are commonly connected to the word lines WL1 to WL15, respectively. The word line WL extends in the row direction. The gates of the back gates BT are commonly connected to a back gate line BG.

The gates of the select gates S1 of the plurality of memory units MU arrayed along the row direction of each block BLK are commonly connected to a select gate line SGD. The drains of the select gates S1 of the plurality of memory units MU arrayed along the column direction are commonly connected to the bit line BL. The select gate line SGD extends in the row direction.

The gates of the select gates S2 of the plurality of memory units MU arrayed along the row direction of each block BLK are commonly connected to a select gate line SGS. The sources of the select gates S2 of the two memory units MU arrayed along the column direction are connected to the same source line SRC. The sources of the select gates S2 of the plurality of memory units MU arrayed along the row direction of each block BLK are connected to the same source line SRC. The select gate line SGS and the source line SRC extend in the row direction.

The memory cell MC has a sectional structure in FIG. 36. For example, the word line (a control gate) WL is made of polysilicon. A through-hole is made in the plurality of word lines WL and an insulating film IN3 between the word lines WL. A memory gate insulating layer IN2 is formed in the surface of the through-hole, and the semiconductor layer SP is formed in the through-hole. The semiconductor layer SP extends in the stacking direction. For example, the semiconductor layer SP is made of semiconductor (for example, silicon) in which an impurity is added. A channel is formed in the semiconductor layer SP.

The memory gate insulating layer IN2 includes a tunnel insulating layer IN2c, a charge storage layer IN2b, and a block insulating layer IN2a. The tunnel insulating layer IN2c is formed so as to surround the semiconductor layer SP. The charge storage layer IN2b is formed so as to surround the tunnel insulating layer IN2c. The block insulating layer IN2a is formed so as to surround the charge storage layer IN2b. It is not always necessary for the select gates S1 and S2 to include the charge storage layer IN2b and the block insulating layer IN2a, but the select gates S1 and S2 may include only the tunnel insulating layer (the gate insulating film) IN2c.

For example, the tunnel insulating layer IN2c and the block insulating layer IN2a are made of silicon oxide ($SiO_2$). For example, the charge storage layer IN2b is made of silicon nitride (SiN). The semiconductor layer SP, the tunnel insulating layer IN2c, the charge storage layer IN2b, and the block insulating layer IN2a constitute a MONOS transistor. Each of the back gate line BG, the word line WL, and the select gate lines SGD and SGS is formed so as to surround the semiconductor layer SP and the memory gate insulating layer IN2.

[2. Screening Operation]

A test method (the screening operation) of the sixth embodiment will be described below. FIG. 37 is a flowchart illustrating the screening operation of an SSD 1. When the self-running mode is started, an SSD controller 2 performs the screening.

(Data Pattern Selection)

The SSD controller 2 selects a data pattern in which a data retention failure easily happens for the program operation in S1003 (Step S1008). In the sixth embodiment, the SSD controller 2 selects one of a first data pattern and a second data pattern. Desirably the SSD controller 2 selects the second data pattern, when the data pattern selection process is performed again in Step S1000 after the first data pattern is selected. Desirably the SSD controller 2 selects the first data pattern, when the data pattern selection process is performed again in Step S1000 after the second data pattern is selected. That is, the processes of the screening with the first data pattern→the screening with the second data pattern→the screening with the first data pattern→the screening with the second data pattern→ . . . are repeated. Therefore, the SSD controller 2 can evenly perform the screening to the odd-numbered word lines WL and the even-numbered word lines WL. The detailed data pattern is described later in the program in Step S1003.

(Processed List Clear)

The SSD controller 2 clears the list used to manage the block to which the screening process is already performed (the processed list) (Step S1000). The processed list is stored in a RAM of the SSD controller 2.

(Block Selection)

The SSD controller 2 selects a block from a user area 3C of a NAND flash memory 3 (Step S1001). The block selection is identical to that in Step S301 of FIG. 10.

(Erase)

Then the SSD controller 2 erases the data of the selected block (Step S1002).

(Program)

In the memory unit of the sixth embodiment, the charge storage layers are connected to each other between the word lines. Therefore, in the case that the memory cell adjacent to the memory cell in the program state is in the erase state, recoupling of a hole and an electron is generated between the memory cells adjacent to each other, the threshold of the memory cell in the program state is lowered (a lateral falling out phenomenon). In the sixth embodiment, the data pattern in which the data retention failure easily happens is programmed to the block to generate the data retention failure, and the block in which the data retention failure happens is screened.

The case that 2 bits (the lower page and the upper page) are stored in the memory cell will be described by way of example. The memory cell having the pieces of data "11", "01", "10", and "00", in which the lower page and the upper page are written, has threshold voltages E, A, B, and C, and a relationship of E<A<B<C holds. An E level is the erase state. The SSD controller 2 programs the data in the selected block (Step S1003).

FIG. 38 illustrates the program operation in selecting the first data pattern. In the program in Step S1003, the SSD controller 2 programs a C level (a highest threshold level) in the even-numbered pages of the selected block. That is, the data pattern of "ECECEC . . . " is programmed in the memory unit. At this point, because the pieces of data programmed in the adjacent memory cells always become a pair of the C level and the E level, the worst data pattern of the data retention failure can be reproduced.

In order to reproduce the worst data pattern of the data retention failure, the data pattern programmed using the first data pattern of the sixth embodiment becomes " . . . ECECEC . . . ". However, the data pattern is not limited to " . . . ECECEC . . . ". The data pattern of " . . . CEECEE . . . ", namely, the data pattern in which only the memory cell adjacent to one of the memory cells in the erase state is in the C level may be used.

The SSD controller 2 generates the ECC code from the data pattern of " . . . ECECEC . . . ", and records the ECC code in the NAND flash memory 3. For example, the SSD controller 2 generates the ECC code every physical page of the physical sector belonging to each word line WL, and stores the ECC code in a spare area of the physical page.

Figure 39:
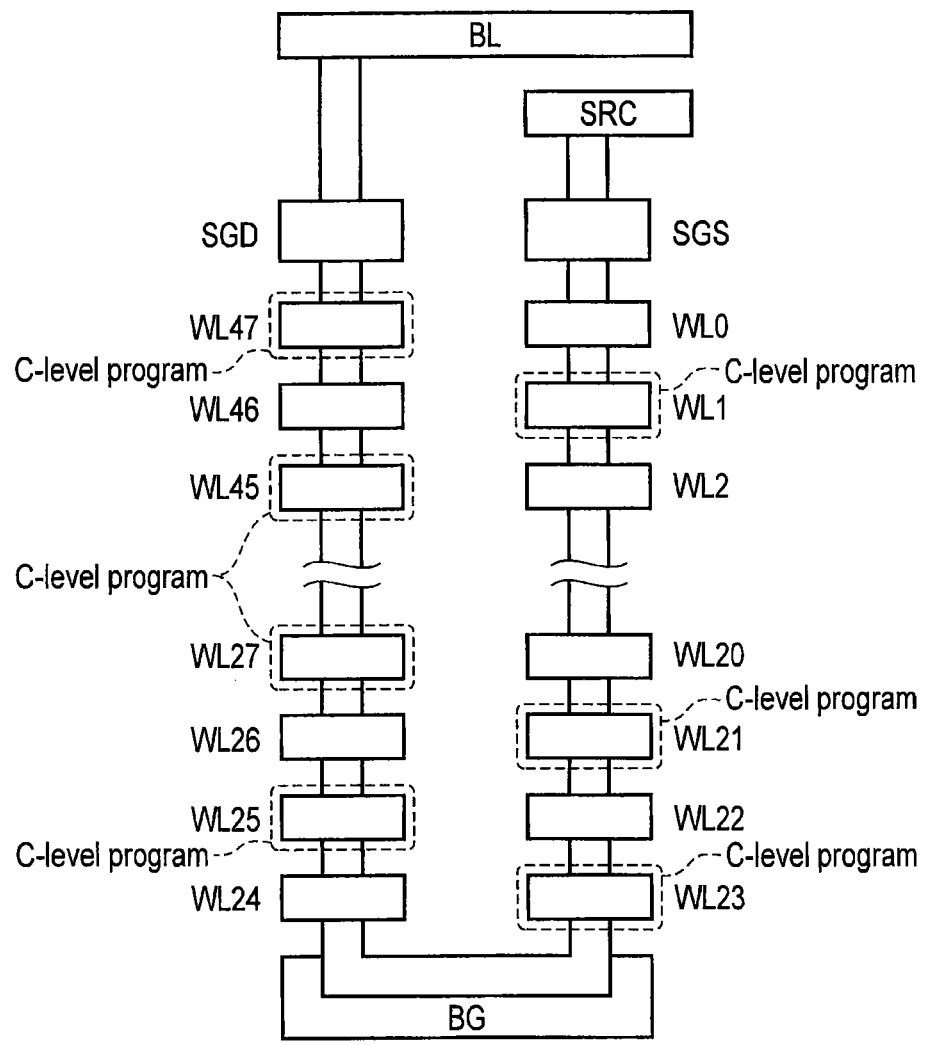
FIG. 39 is a view illustrating the program operation.

FIG. 39 illustrates the program operation in selecting the second data pattern. In the program in Step S1003, the SSD controller 2 programs the C level (the highest threshold level) in the odd-numbered pages of the selected block. That is, the data pattern of "CECECE . . . " is programmed in the memory unit. At this point, because the pieces of data programmed in the adjacent memory cells always become the pair of the C level and the E level, the worst data pattern of the data retention failure can be reproduced.

The SSD controller 2 generates the ECC code from the data pattern of " . . . CECECE . . . " and records the ECC code in the NAND flash memory 3. For example, the SSD controller 2 generates the ECC code every physical page of the physical sector belonging to each word line WL, and stores the ECC code in the spare area of the physical page.

The programmed threshold may be a threshold "C+α" larger than the C level. The use of the "C+α" level can enhance an occurrence rate of the data retention failure.

(Read)

Figure 40:
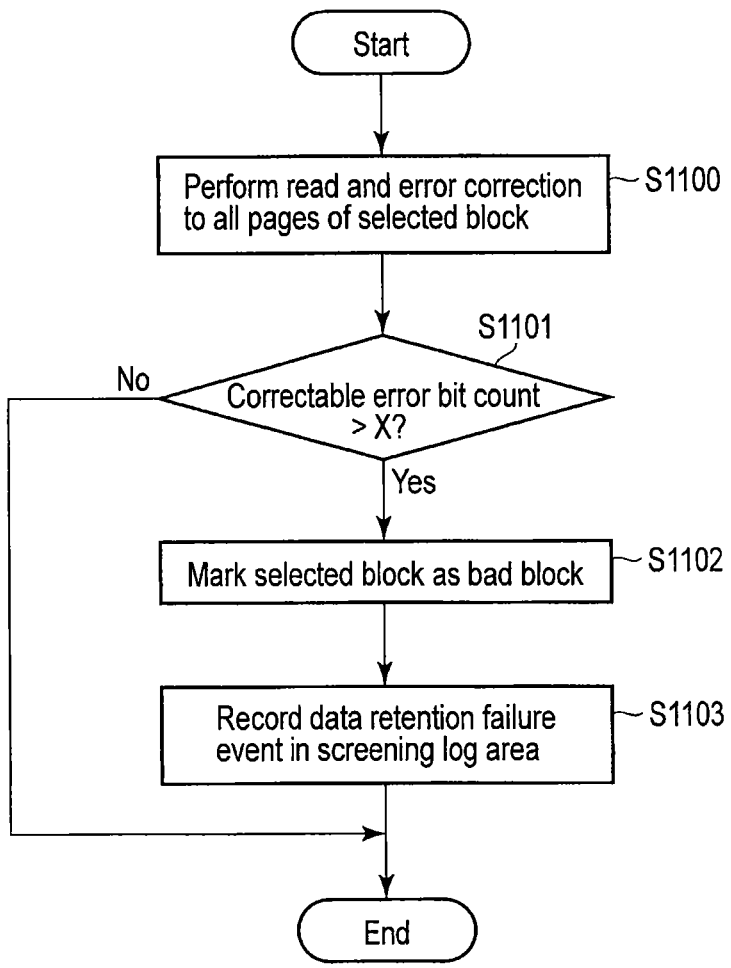
FIG. 40 is a flowchart illustrating a read operation.

Then the SSD controller 2 reads the data from the selected block (Step S1004). In the program operation, because it take a long time to program the data in all the even-numbered pages (or the odd-numbered pages), it is considered that the memory cell having a degraded data retention characteristic loses a charge until the data is read since the data is programmed. FIG. 40 is a flowchart illustrating the read operation in Step S1004.

The SSD controller 2 performs the read process and error correction process (or error detection process) to all the pages of the selected block based on the ECC code (Step S1100). In the sixth embodiment, the SSD controller 2 performs the error detection to the read data using the error correction function of the ECC circuit 2B. Then the SSD controller 2 determines whether the correctable error bit count of the selected block is greater than a predetermined value X, or determines whether an uncorrectable ECC error happens (Step S1101).

In Step S1100, the reading and the error correction may be performed only to the pages in which the C level is programmed. Alternatively, the reading and the error correction may be performed only to the pages in the E level. Therefore, the number of read target pages is decreased, so that the read time can be shortened.

When the correctable error bit count is less than or equal to the predetermined value X, or when the error correction is successfully performed (No in Step S1101), the failure rate of the data retention failure is supposed to be small, and the read process is normally ended.

On the other hand, when the correctable error bit count is greater than the predetermined value X, or when the error correction is unsuccessfully performed (Yes in Step S1101), the selected block is determined to be the data retention failure. The SSD controller 2 marks the selected block as the bad block (Step S1102). That is, the SSD controller 2 adds the selected block to the bad block management table 3D of the management information area 3B. Therefore, the block marked as the bad block is not used to write the data. The SSD controller 2 records a data retention failure event in a screening log area 3E (Step S1103).

Desirably waiting process for a predetermined time is inserted between the program in Step S1003 and the read in Step S1004. Therefore, the data retention failure can more strictly be screened. The predetermined time may arbitrarily be set.

Figure 37A:
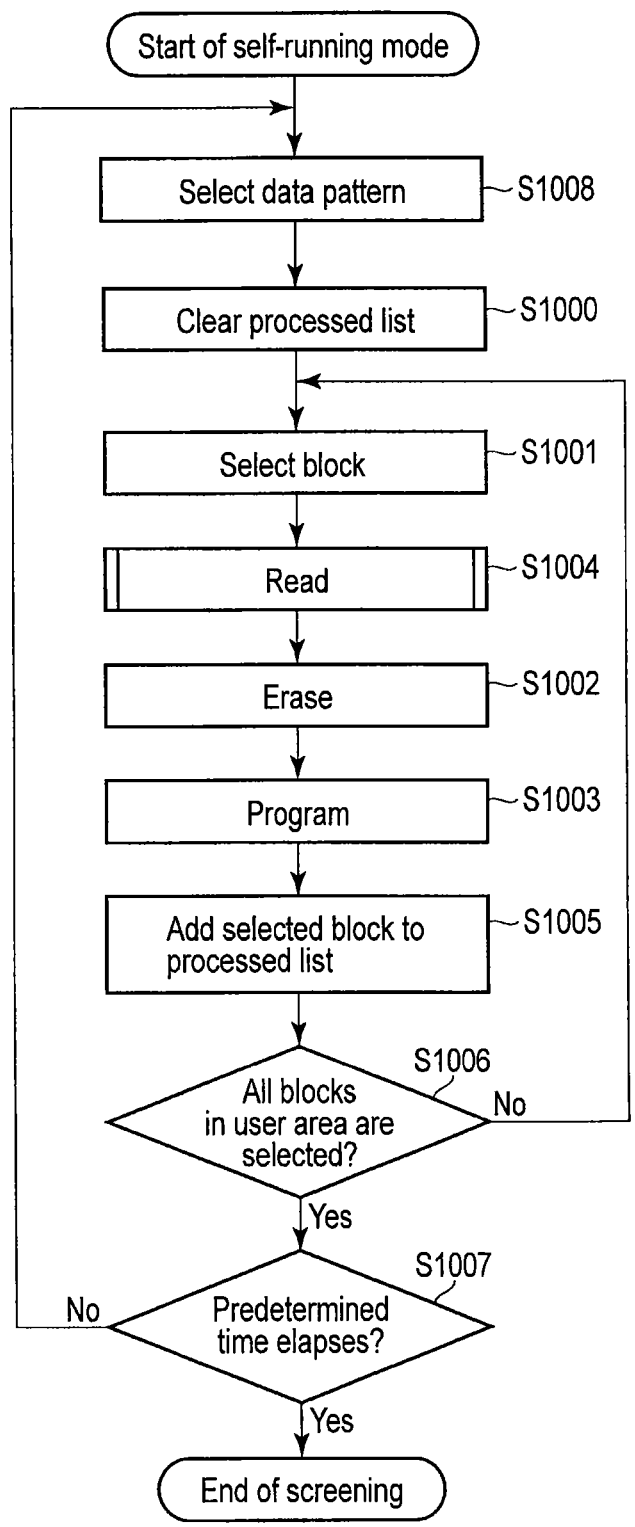
FIG. 37A is a flowchart illustrating the SSD screening operation.

The SSD controller 2 may perform a processing flow in the FIG. 37A instead of the processing flow in FIG. 37. In the processing flow in the FIG. 37A, the data retention failure is detected in the pre-read. Because the data is read after the first data pattern or the second data pattern is written to all the blocks, an elapsed time from the data write to the data read is lengthened compared with the case in FIG. 37, and the SSD controller 2 can more efficiently detect the data retention failure.

In the sixth embodiment, the SSD controller 2 performs the error detection to the read data using an ECC circuit 2B and the ECC code, and determines whether the first data pattern or second data pattern is read. The method of the sixth embodiment can perform the read process in Step S1004 at high speed. Alternatively, the SSD controller 2 may make the determination by directly comparing the read data to the first data pattern or second data pattern that is of the write data without using the ECC circuit 2B and the ECC code. The SSD controller 2 determines that the read data is the read error when the number of bits in each of which the read data is not matched with the write data is greater than or equal to a given value (compare error).

Referring to FIG. 37, the SSD controller 2 adds the selected block to the processed list (Step S1005). Instead of the processed list in Step S1000, the SSD controller 2 may initialize an unprocessed list stored in the RAM, and delete the selected block from the unprocessed list in Step S1005. Then the SSD controller 2 determines whether all the blocks in the user area 3C of the NAND flash memory 3 are selected (Step S1006). When all the blocks in the user area 3C of the NAND flash memory 3 are not selected (No in Step S1006), the SSD controller 2 returns to Step S1001 to select the next block.

When all the blocks are selected (Yes in Step S1006), the SSD controller 2 determines whether a predetermined time elapses (Step S1007). Alternatively, in Step S1007, the SSD controller 2 may determine whether the number of loops reaches a predetermined value. When the predetermined time does not elapse (or when the number of loops does not reach the predetermined value), the processes in Steps S1000 to S1006 are repeated. On the other hand, When the predetermined time elapses (or when the number of loops reaches the predetermined value) (Yes in Step S1007), the screening operation is ended.

The entire screening is summarized in FIG. 41, the operator connects the SSD to the thermostatic chamber (Step S500), the SSD controller 2 automatically starts the self-running mode to start the screening (Step S501), and the SSD controller 2 performs the screening having the data retention failure detection function in FIG. 37 (Step S502). The SSD controller 2 automatically ends the self-running mode (Step S503). As illustrated in FIGS. 20 and 21, the cycle including the normal erase, write, and read may be performed (Step S504), or the stress process may be performed (Step S505).

[3. Post-Screening Test]

When the screening process is ended, the operator detaches the SSD 1 from the power-supply device 40, connects the SSD 1 to the test device 100 as illustrated in FIG. 22, and controls the test device 100. The test device 100 performs the post-screening test. The post-screening test is identical to that in FIG. 23. At this point, the pre-read failure is replaced for the data retention failure.

[4. Advantageous Effect]

As described above, because the pieces of data programmed in the adjacent memory cells always become the pair of the C level and the E level, the worst data pattern of the data retention failure can be reproduced. The SSD controller 2 marks the selected block in which the data retention failure happens as the bad block such that the data is not read from and written to the block. Therefore, even if the block has the high data retention failure rate, the block is screened as the bad block before the shipment, and the field failure rate caused by the data retention failure can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-transitory computer-readable storage medium having stored thereon a program for testing a nonvolatile semiconductor memory which is executable by a computer, the nonvolatile semiconductor memory including a first area and a second area, each of the first area and the second area including blocks, data being written in a unit of page to the first area and the second area, data being erased in a unit of block that is of a multiple of a natural number of at least 2 of the unit of page, wherein the program is configured to cause a controller that controls the nonvolatile semiconductor memory to perform a first test process, the first test process performs first to sixth processes every block included in the first area, the first process performs block erase, the second process performs data write to a first block to which the block erase is performed after the first process, the third process performs first read in which data is read from first pages except a second page in the first block after the second process, the fourth process performs second read in which data is read from the second page after the third process, the fifth process records an event indicating a first read error in the second area when a read error happens in the third process, and the sixth process records an event indicating a second read error in the second area when a read error happens in the fourth process.

2. The medium of claim 1, wherein the first test process further performs a seventh process and an eighth process every block included in the first area, the seventh process reads data from a block that is of a target of the block erase performed by the first process before the first process, and the eighth process records an event indicating a third read error in the second area when a read error happens in the seventh process.

3. The medium of claim 2, wherein the program further comprises;

a process of ending the first test process when the read error happens in the seventh process; and a process of notifying a test device connectable to the controller that the first test process is ended.

4. The medium of claim 1, wherein the first test process further performs a ninth process and a tenth process every block included in the first area, the ninth process reads data from the first block after the second process and before the third process, and the tenth process records an event indicating a fourth read error in the second area when a read error happens in the ninth process.

5. The medium of claim 1, wherein an address of the second page is changed every block included in the first area.

6. The medium of claim 1, wherein the program further comprises a second test process of performing the first to sixth processes every block included in the first area when a predetermined time does not elapse since the first test process is started after the first test process.

7. The medium of claim 6, wherein an address of the second page in the second test process differs from an address of the second page in the first test process.

8. The medium of claim 1, wherein the nonvolatile semiconductor memory further includes a firmware area in which firmware can be stored, the firmware being used to perform one of a normal mode that performs an operation in response to an instruction of a host device and a self-test mode that performs a test irrespective of the instruction of the host device, and the program further comprises:

a process of reading the firmware from the nonvolatile semiconductor memory to determine whether the firmware is set to the normal mode or the self-test mode; and a process of performing the first test process when the firmware is set to the self-test mode.

9. A non-transitory computer-readable storage medium having stored thereon a program for testing a nonvolatile semiconductor memory which is executable by a computer, the nonvolatile semiconductor memory including a first area and a second area, each of the first area and the second area including blocks, data being written in a unit of page to the first area and the second area, data being erased in a unit of block that is of a multiple of a natural number of at least 2 of the unit of page, wherein the program is configured to cause a controller that controls the nonvolatile semiconductor memory to perform a first test process, the first test process performs first to sixth processes every block included in the first area, the first process performs block erase, the second process performs data write to a first block to which the block erase is performed after the first process, the third process performs first read in which data is read from the first block after the second process, the fourth process performs second read in which data is read from a first page in the first block after the third process, the fifth process records an event indicating a first read error in the second area when a read error happens in the third process, and the sixth process records an event indicating a second read error in the second area when a read error happens in the fourth process.

10. A test method for testing a nonvolatile semiconductor memory including a first area and a second area, each of the first area and the second area including blocks, data being written in a unit of page to the first area and the second area, data being erased in a unit of block that is of a multiple of a natural number of at least 2 of the unit of page, the method comprising:

performing a first test process that performs first to sixth processes every block included in the first area, wherein the first process performs block erase, the second process performs data write to a first block to which the block erase is performed after the first process, the third process performs first read in which data is read from first pages except a second page in the first block after the second process, the fourth process performs second read in which data is read from the second page after the third process, the fifth process records an event indicating a first read error in the second area when a read error happens in the third process, and the sixth process records an event indicating a second read error in the second area when a read error happens in the fourth process.

11. The method of claim 10, wherein the first test process further performs a seventh process and an eighth process every block included in the first area, the seventh process reads data from a block that is of a target of the block erase performed by the first process before the first process, and the eighth process records an event indicating a third read error in the second area when a read error happens in the seventh process.

12. The method of claim 11, further comprising:
a process of ending the first test process when the read error happens in the seventh process, and
a process of notifying a test device connectable to the controller that the first test process is ended.

13. The method of claim 10, wherein
the first test process further performs a ninth process and a tenth process every block included in the first area,
the ninth process reads data from the first block after the second process and before the third process, and
the tenth process records an event indicating a fourth read error in the second area when a read error happens in the ninth process.

14. The method of claim 10, wherein an address of the second page is changed every block included in the first area.

15. A non-transitory computer-readable storage medium having stored thereon a program for testing a nonvolatile semiconductor memory which is executable by a computer, the nonvolatile semiconductor memory including a first area and a second area, each of the first area and the second area including blocks, data being written in a unit of page to the first area and the second area, data being erased in a unit of block that is of a multiple of a natural number of at least 2 of the unit of page, the block including memory strings, memory cells being connected in series in each of the memory strings, a charge storage layer being shared by the memory cells,
the program controlling a controller that controls the nonvolatile semiconductor memory to function as:
a process of performing erase every block included in the first area;
a process of selecting memory cells, which are not adjacent to each other in the memory string of the block, as a first group from the block;
a process of selecting memory cells except the first group in the memory string of the block as a second group from the block;
a process of performing write to the first group; and
a process of reading the block after the write,
wherein the read comprises:
a process of detecting an error bit; and
a process of recording an event indicating a read error in the second area when the read error happens.

16. The medium of claim 15, wherein the read is performed to at least one of the first group and the second group.

17. The medium of claim 15, wherein
data of one or more bits can be stored in the memory cell by using a threshold voltage distribution indicating an erase state in which data is erased and one or more threshold voltage distributions which are higher than the threshold voltage distribution indicating the erase state and indicate a write state in which data is written, and
data corresponding to the highest threshold voltage distribution of the one or more threshold voltage distributions is used in the write.

18. The medium of claim 15, wherein
the nonvolatile semiconductor memory further includes a firmware area in which firmware can be stored, the firmware being used to perform one of a normal mode that performs an operation in response to an instruction of a host device and a self-test mode that performs a test irrespective of the instruction of the host device, and
the program further comprises:
a process of reading the firmware from the nonvolatile semiconductor memory to determine whether the firmware is set to the normal mode or the self-test mode; and
a process of performing the first test process when the firmware is set to the self-test mode.

19. A test method for testing a nonvolatile semiconductor memory including a first area and a second area, each of the first area and the second area including blocks, data being written in a unit of page to the first area and the second area, data being erased in a unit of block that is of a multiple of a natural number of at least 2 of the unit of page, the block including memory strings, memory cells being connected in series in each of the memory strings, a charge storage layer being shared by the memory cells,
the test method comprising:
a process of performing erase every block included in the first area;
a process of selecting memory cells, which are not adjacent to each other in the memory string of the block, as a first group from the block;
a process of selecting memory cells except the first group in the memory string of the block as a second group from the block;
a process of performing write to the first group; and
a process of reading the block after the write,
wherein the read comprises:
a process of detecting an error bit; and
a process of recording an event indicating a read error in the second area when the read error happens.

20. The method of claim 19, wherein the read is performed to at least one of the first group and the second group.

* * * * *